(12) United States Patent
Kamakura et al.

(10) Patent No.: US 11,894,834 B2
(45) Date of Patent: Feb. 6, 2024

(54) VIBRATOR DEVICE

(71) Applicant: Seiko Epson Corporation, Toyko (JP)

(72) Inventors: Tomoyuki Kamakura, Matsumoto (JP); Yusuke Matsuzawa, Chino (JP)

(73) Assignee: SEIKO EPSON CORPORATION

( * ) Notice: Subject to any disclaimer, the term of this patent is extended or adjusted under 35 U.S.C. 154(b) by 390 days.

(21) Appl. No.: 17/215,339

(22) Filed: Mar. 29, 2021

(65) Prior Publication Data

US 2021/0305966 A1 Sep. 30, 2021

(30) Foreign Application Priority Data

Mar. 30, 2020 (JP) .................................. 2020-059821

(51) Int. Cl.
| | | |
|---|---|---|
| H03H 9/19 | (2006.01) | |
| H03H 3/02 | (2006.01) | |
| H03H 9/10 | (2006.01) | |
| H03H 9/05 | (2006.01) | |
| H03H 9/02 | (2006.01) | |

(52) U.S. Cl.
CPC ............... *H03H 9/19* (2013.01); *H03H 3/02* (2013.01); *H03H 9/02086* (2013.01); *H03H 9/0557* (2013.01); *H03H 9/1021* (2013.01)

(58) Field of Classification Search
CPC ........ H03H 9/19; H03H 9/02; H03H 9/02086; H03H 9/0557; H03H 9/1021; H03H 9/88
See application file for complete search history.

(56) References Cited

U.S. PATENT DOCUMENTS

| | | | | |
|---|---|---|---|---|
| 2004/0036547 | A1* | 2/2004 | Harima | ................ H03H 9/0547 |
| | | | | 331/158 |
| 2009/0091904 | A1* | 4/2009 | Hatanaka | ............. H03H 9/0542 |
| | | | | 361/764 |
| 2019/0027676 | A1* | 1/2019 | Yasuda | ................ H10N 30/877 |
| 2019/0165732 | A1 | 5/2019 | Ito et al. | |

FOREIGN PATENT DOCUMENTS

| | | | |
|---|---|---|---|
| JP | 2002076775 A | * | 3/2002 |
| JP | 2005-109577 A | | 4/2005 |
| JP | 2008-035277 A | | 2/2008 |
| JP | 2015-033076 A | | 2/2015 |
| JP | 2019-097149 A | | 6/2019 |

* cited by examiner

*Primary Examiner* — J. San Martin
(74) *Attorney, Agent, or Firm* — Harness, Dickey & Pierce, P.L.C.

(57) ABSTRACT

A vibrator device includes a vibrator element, a container in which the vibrator element is housed, a circuit which is disposed in the container, and which overlaps the vibrator element in a plan view, and an inductor which is disposed in the container, which fails to overlap the vibrator element in the plan view, and which is electrically coupled to the circuit. The container includes at least a first member and a second member, and a bonding area configured to bond the first member and the second member to each other, and the inductor is disposed in the bonding area.

8 Claims, 14 Drawing Sheets

VIBRATOR DEVICE

The present application is based on, and claims priority from JP Application Serial Number 2020-059821, filed Mar. 30, 2020, the disclosure of which is hereby incorporated by reference herein in its entirety.

BACKGROUND

1. Technical Field

The present disclosure relates to a vibrator device.

2. Related Art

There has been known a vibrator device such as an oscillator for oscillating a vibrator to output a signal with a desired frequency.

In JP-A-2019-097149 (Document 1), there is disclosed an oscillator provided with a vibrator and an integrated circuit element including an inductor. The vibrator has a vibrator element, electrodes provided to the vibrator element, and a container for housing the vibrator element and the electrodes. Further, in the oscillator described in Document 1, in order to reduce the deterioration of the Q-value of the inductor, the electrodes formed of metal do not overlap the inductor in a plan view.

In the oscillator described in Document 1, the inductor is incorporated in the integrated circuit element disposed separately from the vibrator. However, when the inductor is incorporated in the integrated circuit element, in order to avoid the overlap between the inductor and the electrodes in the plan view taking the crosstalk inside the integrated circuit element into consideration, the place where the inductor can be disposed is limited. Therefore, it is difficult to achieve further reduction in size of the integrated circuit element. As a result, there is a problem that it is difficult to achieve further reduction in size of the oscillator.

SUMMARY

A vibrator device according to an aspect of the present disclosure includes a vibrator element, a container in which the vibrator element is housed, a circuit which is disposed in the container, and which overlaps the vibrator element in a plan view, and an inductor which is disposed in the container, which fails to overlap the vibrator element in the plan view, and which is electrically coupled to the circuit.

DESCRIPTION OF EXEMPLARY EMBODIMENTS

Figure 1:
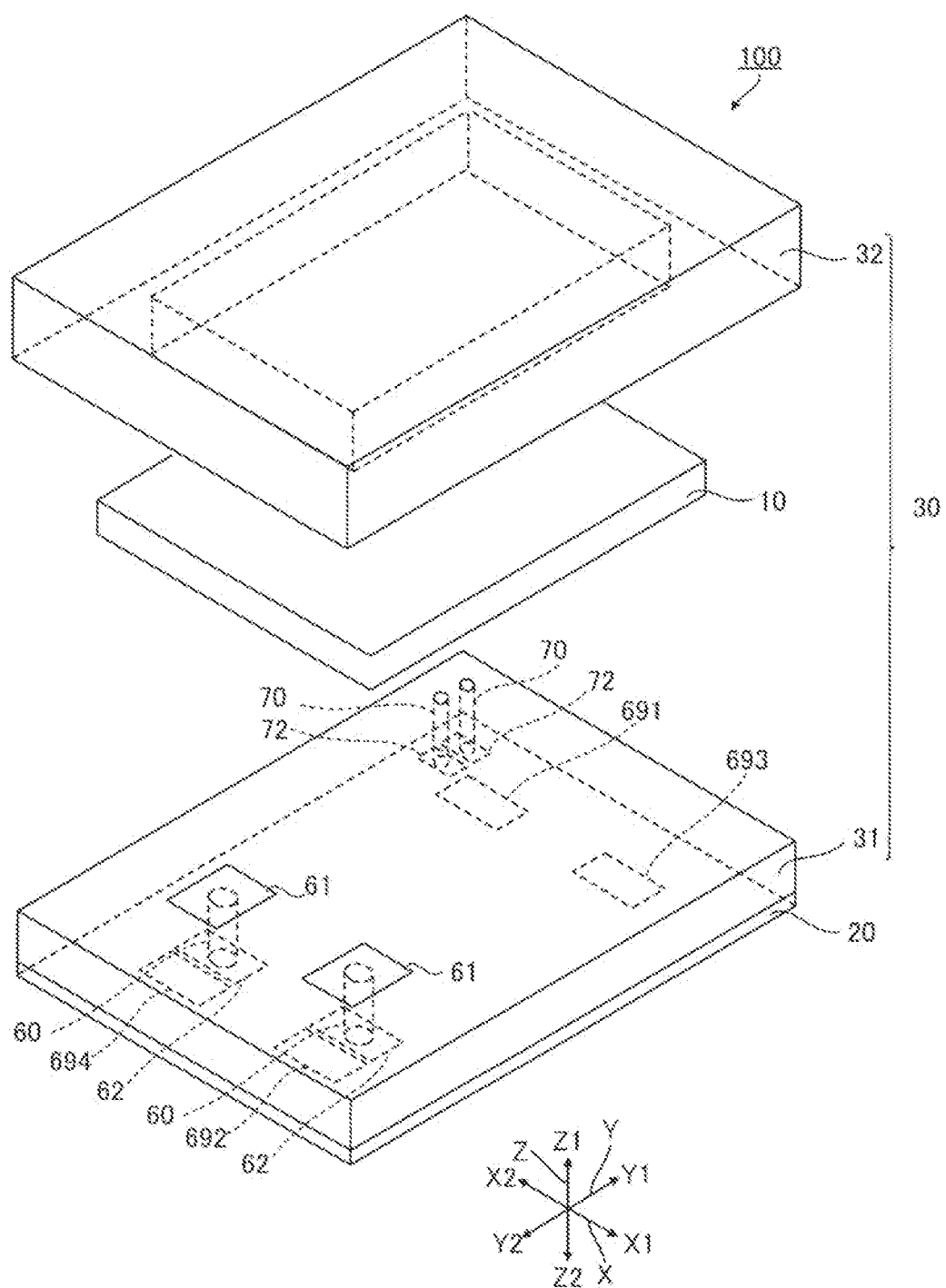
FIG. 1 is an exploded perspective view schematically showing a vibrator device according to a first embodiment.

Some preferred embodiments of the present disclosure will hereinafter be described with reference to the accompanying drawings. It should be noted that in the drawings, the dimension or the scale size of each section is arbitrarily different from the reality, and some portions are schematically shown in order to make understanding easy. Further, the scope or the spirit of the present disclosure is not limited to these embodiments unless there is a particular description of limiting the present disclosure in the following explanation.

1. Vibrator Device

1A. First Embodiment

FIG. 1 is an exploded perspective view schematically showing a vibrator device 100 according to a first embodiment. The description will hereinafter be presented arbitrarily using an X axis, a Y axis, and a Z axis perpendicular to each other for the sake of convenience of explanation. Further, one direction along the X axis from an arbitrary point is described as an X1 direction, and an opposite direction to the X1 direction is described as an X2 direction. Similarly, one direction along the Y axis from an arbitrary point is described as a Y1 direction, an opposite direction to the Y1 direction is described as a Y2 direction, one direction along the Z axis from an arbitrary point is described as a Z1 direction, and an opposite direction to the Z1 direction is described as a Z2 direction. Further, a view in the Z1 direction or the Z2 direction is referred to as a "plan view."

Further, the Z1 direction is defined as an "upper side," and the Z2 direction is defined as a "lower side."

1A-1. Overall Configuration of Vibrator Device 100

The vibrator device 100 shown in FIG. 1 is, for example, an oscillator. As shown in FIG. 1, the vibrator device 100 has a vibrator element 10, a circuit 20, and a container 30. The container 30 houses the vibrator element 10. The container 30 has a base substrate 31 as a first member, and a lid body 32 as a second member. Further, the base substrate 31 is formed of a semiconductor substrate, and the base substrate 31 and the circuit 20 constitute an IC (Integrated Circuit) board.

The vibrator element 10 has, for example, a vibrator substrate and electrodes disposed on a surface of the vibrator substrate. The vibrator substrate is formed of, for example, an AT-cut quartz crystal substrate vibrating in a thickness-shear vibration mode. Further, since the vibrator substrate is formed of a quartz crystal substrate, it is possible to obtain the vibrator element 10 having an excellent temperature characteristic compare to a case where the vibrator substrate is formed of other piezoelectric material.

It should be noted that the vibrator substrate is not limited to one formed of the AT-cut quartz crystal substrate, and can also be formed of a quartz crystal substrate other than the AT-cut quartz crystal substrate such as an X-cut quartz crystal substrate, a Y-cut quartz crystal substrate, a Z-cut quartz crystal substrate, a BT-cut quartz crystal substrate, an SC-cut quartz crystal substrate, or an ST-cut quartz crystal substrate. Further, the vibrator element 10 is not limited to the piezoelectrically-actuated vibrator unit, but can be an electrostatically-actuated vibrator unit using electrostatic force.

Further, the material of the vibrator substrate is not limited to the quartz crystal, but it is possible for the vibrator substrate to be formed of a piezoelectric single-crystal body made of, for example, lithium niobate, lithium tantalate, lithium tetraborate, langasite crystal, potassium niobate, or gallium phosphate, or to be formed of a piezoelectric single-crystal body made of another material than these. Further, the vibrator element 10 can be a so-called MEMS (Micro Electro Mechanical Systems) vibrator unit in which a piezoelectric film and electrodes are provided to a substrate such as a silicon substrate. The piezoelectric film is made of, for example, aluminum nitride. The electrodes can be made of molybdenum, titanium, gold, nickel, aluminum, titanium nitride, or the like.

Further, the vibrator element 10 is not limited to one vibrating in the thickness-shear vibration mode, and can be, for example, a tuning-fork vibrator unit having a plurality of vibrating arms flexurally vibrating in an in-plane direction, a tuning-fork vibrator unit having a plurality of vibrating arms flexurally vibrating in an out-of-plane direction, a gyro sensor element which is provided with a drive arm making a drive vibration and a detection arm making a detection vibration, and which detects angular velocity, or an acceleration sensor element provided with a detection section for detecting the acceleration.

Therefore, as an example of the vibrator device 100, there can be cited an inertial sensor such as an acceleration sensor, or an angular velocity sensor, a force sensor such as an inclination sensor, and so on besides a variety of types of oscillators such as a quartz crystal oscillator, a voltage-controlled crystal oscillator, a temperature-compensated crystal oscillator, a constant-temperature oven-attached crystal oscillator, a SAW (Surface Acoustic Wave) oscillator, or an MEMS oscillator.

1A-2. Circuit Configuration

Figure 2:
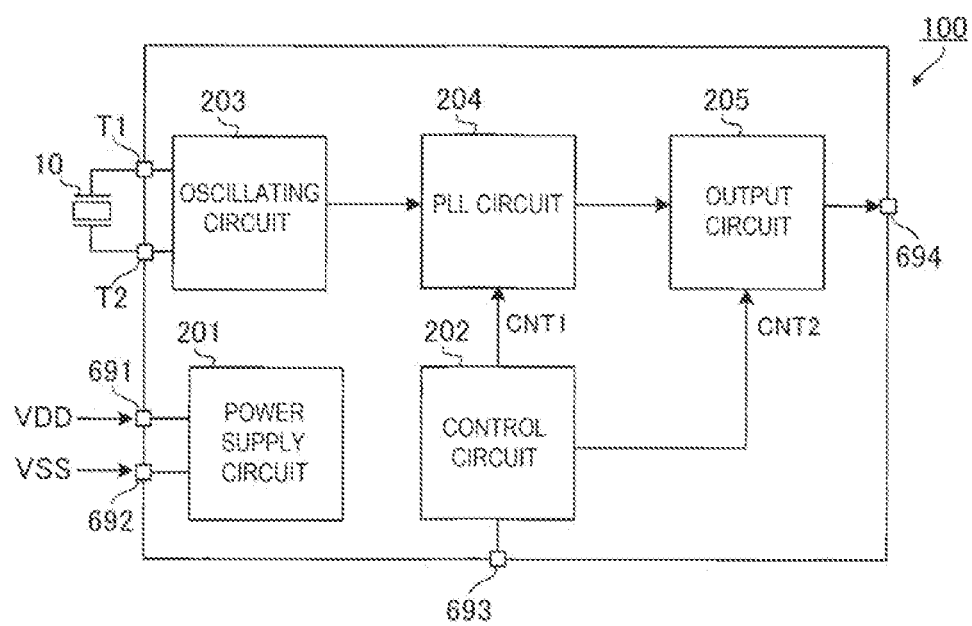
FIG. 2 is a block diagram showing a circuit configuration of the vibrator device shown in FIG. 1.

FIG. 2 is a block diagram showing a circuit configuration of the vibrator device 100 shown in FIG. 1. As shown in FIG. 2, the vibrator device 100 includes a power supply circuit 201, a control circuit 202, an oscillating circuit 203, a PLL (Phase Locked Loop) circuit 204, and an output circuit 205. Further, the vibrator device 100 has a VDD terminal 691, a VSS terminal 692, a control terminal 693, and an output terminal 694.

The power supply circuit 201 generates a predetermined voltage based on the power supply voltage supplied from the outside via the VDD terminal 691 and a ground voltage supplied via the VSS terminal 692. The predetermined voltage becomes the power supply voltage for each circuit provided to the vibrator device 100.

The control circuit 202 generates a control signal CNT1 and a control circuit CNT2 based on a signal supplied from the outside via the control terminal 693.

The oscillating circuit 203 is coupled to one end of the vibrator element 10 via an XG terminal T1, and is coupled to the other end of the vibrator element 10 via an XD terminal T2. The oscillating circuit 203 is a circuit for oscillating the vibrator element 10. The oscillation circuit constituted by the oscillating circuit 203 and the vibrator element 10 is, for example, an inverter oscillation circuit, a pierce oscillation circuit, a Colpitts oscillation circuit, or a Hartley oscillation circuit.

The PLL circuit 204 generates an oscillation signal which is synchronized in phase with a signal supplied from the oscillating circuit 203, and which is obtained by multiplying and dividing the frequency of the oscillation signal, and then outputs the oscillation signal. The PLL circuit 204 is, for example, a fractional-N PLL circuit. The multiple and the frequency division ratio are set in accordance with the control signal CNT1 output from the control circuit 202.

The output circuit 205 generates a signal based on the oscillation signal output from the PLL circuit 204, and then outputs that signal. The signal is output to the outside via the output terminal 694. Whether to output the signal is set in accordance with the control signal CNT2 output from the control circuit 202.

1A-3. Configuration of Each Element of Vibrator Device 100

Figure 3:
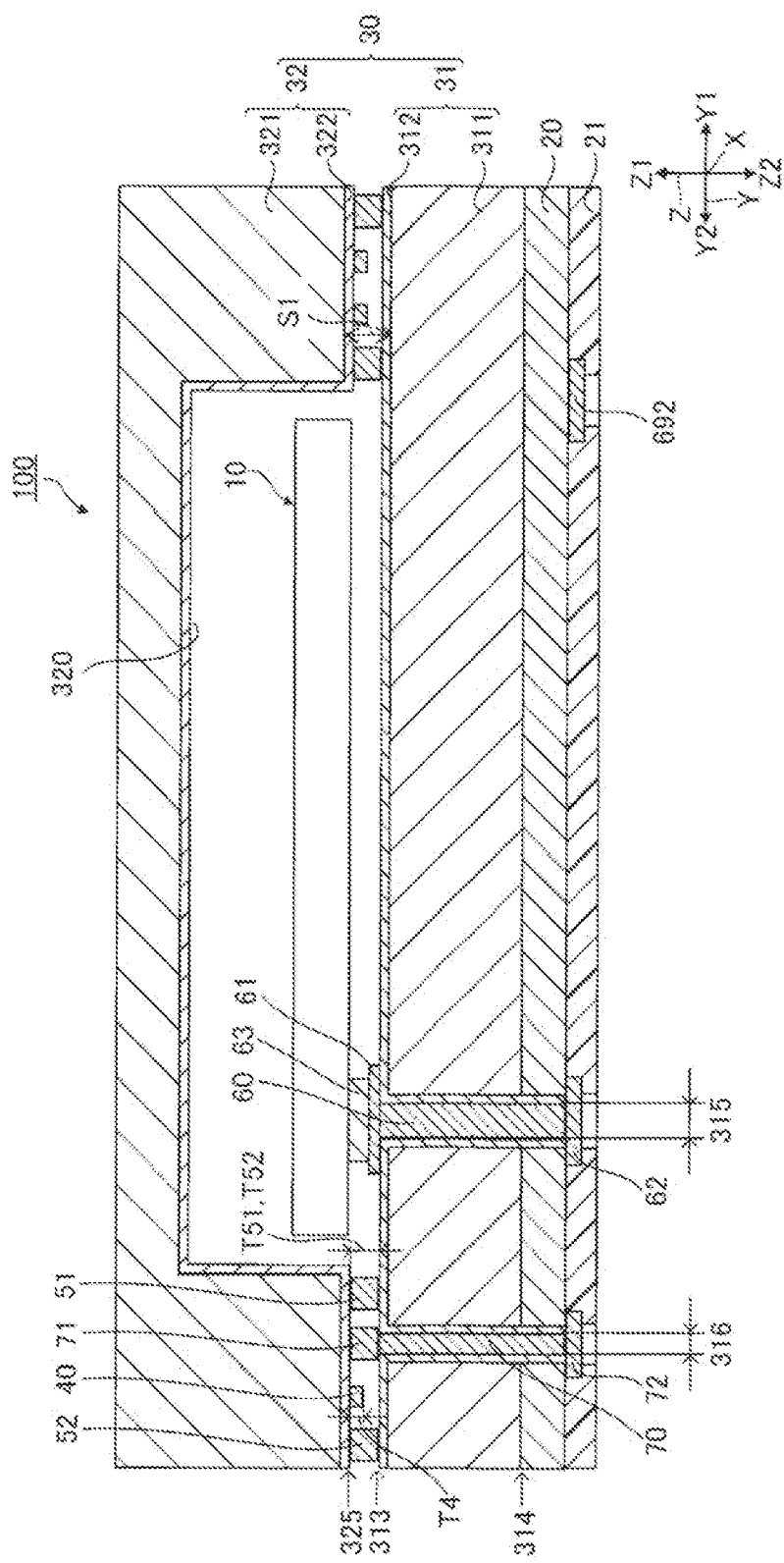
FIG. 3 is a cross-sectional view of the vibrator device shown in FIG. 1.
Figure 4:
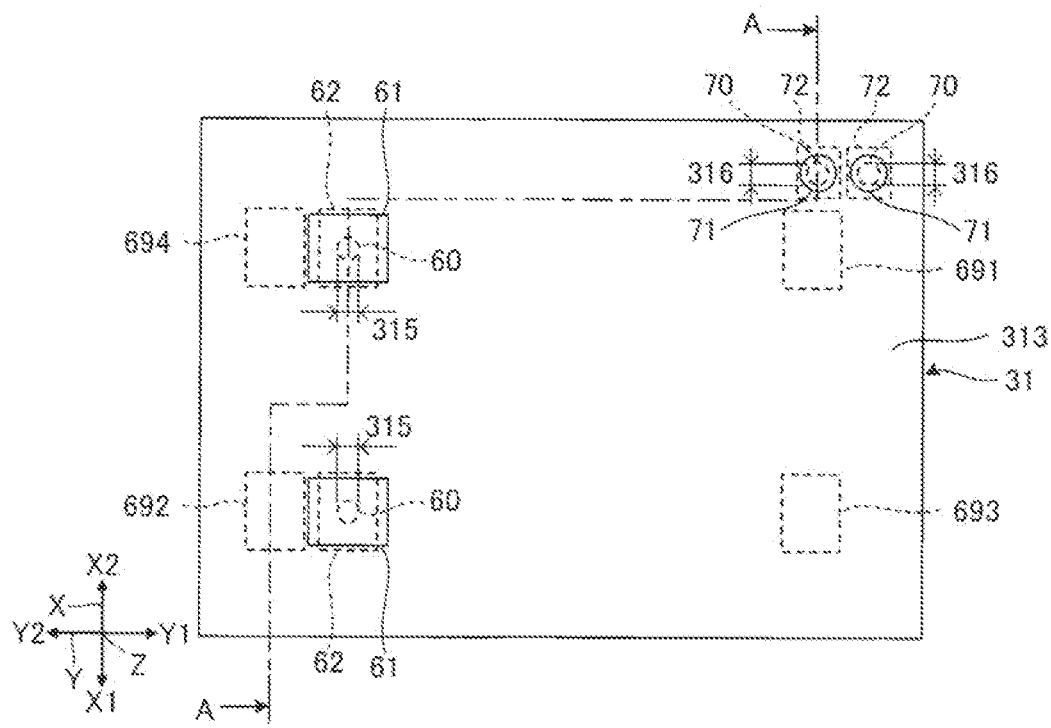
FIG. 4 is a plan view of a base substrate shown in FIG. 1.

FIG. 3 is a cross-sectional view of the vibrator device 100 shown in FIG. 1. FIG. 4 is a plan view of the base substrate 31 shown in FIG. 1. It should be noted that FIG. 3 corresponds to a cross-sectional view along a line A-A in FIG. 4.

As shown in FIG. 3, the vibrator device 100 has an inductor 40, a first shield 51, and a second shield 52 in addition to the vibrator element 10, the circuit 20, and the container 30. The first shield 51 is an illustration of a shield. Further, as shown in FIG. 3 and FIG. 4, the vibrator device 100 has two first interconnections 60, two first coupling terminals 61, two second coupling terminals 62, two electrically-conductive bumps 63, two second interconnections 70, two first terminals 71, and two second terminals 72. Each element of the vibrator device 100 will hereinafter be described.

As shown in FIG. 3, the circuit 20 is disposed in the container 30. Specifically, the circuit 20 is stacked at the Z2 direction side of the base substrate 31. Further, the circuit 20 overlaps the vibrator element 10 in the plan view.

The circuit 20 has, for example, a diffusion layer and a rewiring layer. The diffusion layer is a layer added with a dopant higher in concentration than that of the base substrate 31. The rewiring layer has a plurality of electrically-conductive parts such as interconnections electrically coupled to the diffusion layer, and an insulating film disposed between the electrically-conductive parts. The diffusion layer and the rewiring layer described above form circuit elements such as a transistor, a diode, a resistor, and a capacitor. By combining these circuit elements, the circuit 20 is provided with a variety of types of circuits.

At the Z2 direction side of the circuit 20, there is disposed a passivation film 21. The passivation film 21 covers the circuit 20 to protect the circuit 20. The passivation film 21 is, for example, a silicon nitride film. It should be noted that it is possible to reallocate external terminals and so on in the Z2 direction of the passivation film 21, and dispose a second passivation film made of an organic material or the like, so as to overlap the layer thus reallocated.

As shown in FIG. 3 and FIG. 4, the VDD terminal 691, the VSS terminal 692, the control terminal 693, and the output terminal 694 are disposed on an opposite surface to the base substrate 31 of the circuit 20. As the materials of the respective terminals, there can be cited metal such as aluminum (Al), copper (Cu), or tungsten (W), and an alloy of the metal. The VDD terminal 691, the VSS terminal 692, the control terminal 693, and the output terminal 694 are electrically coupled to the circuit 20.

It should be noted that although in the example shown in FIG. 4, the VDD terminal 691, the VSS terminal 692, the control terminal 693, and the output terminal 694 are disposed at the positions corresponding to the four corners of the container 30 in the plan view, the arrangement of these terminals is not limited to the arrangement shown in FIG. 4, but is arbitrary.

As shown in FIG. 3, the container 30 is disposed at the Z1 direction side of the circuit 20. The container 30 is a member for housing the vibrator element 10. Further, the inside of the container 30 is, for example, an airtightly enclosed space. The container 30 is filled with an inert gas such as nitrogen, helium, or argon. The inside of the container 30 can be kept at pressure lower than the atmospheric pressure. By making the inside of the container 30 be the airtightly enclosed space, stabilization of the vibration characteristic of the vibrator element 10 is achieved. It should be noted that, the inside of the container 30 is not required to be the airtightly enclosed space. Further, the shape in the plan view of the container 30 is a quadrangular shape as shown in FIG. 1, but is not limited thereto, and can be, for example, another polygonal shape.

As shown in FIG. 3, the base substrate 31 has a first substrate 311 and a first oxidized film 312. The first substrate 311 is formed of a semiconductor substrate such as a silicon substrate. Specifically, the first substrate 311 is formed of high-purity single-crystal silicon. Further, the first substrate 311 is added with the dopant, and thus, the first substrate 311 has electrical conductivity. Further, at the Z1 direction side of the first substrate 311, there is disposed the first oxidized film 312. The first oxidized film 312 makes contact with the first substrate 311. The first oxidized film 312 is a film formed of silicon oxide. It should be noted that it is possible to take the first oxidized film 312 as a part of the first substrate 311.

The base substrate 31 has a first surface 313 and a second surface 314. The first surface 313 is a surface opposed to the lid body 32. On the first surface 313, there is disposed the vibrator element 10 via the first coupling terminals 61 and the electrically-conductive bumps 63 described later. Meanwhile, the second surface 314 is a surface opposite to the first surface 313. On the second surface 314, there is disposed the circuit 20.

As shown in FIG. 3 and FIG. 4, the base substrate 31 has two first through holes 315 and two second through holes 316. Each of the first through holes 315 opens in the first surface 313 and the second surface 314. Similarly, each of the second through holes 316 opens in the first surface 313 and the second surface 314. In the illustrated example, each of the first through holes 315 penetrates the circuit 20 in addition to the base substrate 31. Similarly, each of the second through holes 316 penetrates the circuit 20 in addition to the base substrate 31.

It should be noted that the first through holes 315 are formed by depositing the first oxidized film 312 on inside wall surfaces of holes provided to the first substrate 311. Similarly, the second through holes 316 are formed by depositing the first oxidized film 312 on inside wall surfaces of holes provided to the first substrate 311. Therefore, the first oxidized film 312 exists inside the first through holes 315 and the second through holes 316 in addition to an upper surface of the first substrate 311.

Further, although not shown in the drawings, in the first through holes 315 and the second through holes 316, it is possible for a film formed of resin to be disposed between the first oxidized film 312 and the first substrate 311.

As shown in FIG. 3 and FIG. 4, the two interconnections 60 are provided one-on-one to the two first through holes 315. The first interconnections 60 are each a through electrode for electrically coupling the vibrator element 10 and the circuit 20 to each other. Each of the first interconnections 60 is isolated from the first substrate 311 with the first oxidized film 312.

The material of the first interconnections 60 is metal such as aluminum (Al), copper (Cu), or tungsten (W), and an alloy of the metal. It should be noted that the first interconnections 60 can be formed of a single material, or can also be formed of a plurality of materials. Further, it is possible for the first interconnections 60 to be a stacked body formed of a plurality of types of metal films. Further, although the first interconnections 60 are each a rod-like member for filling corresponding one of the first through holes 315 in the example shown in FIG. 3, it is possible for each of the first interconnections 60 to be a film formed along an inside wall surface of the base substrate 31 constituting the first through hole 315. When the first interconnection 60 is that film, there can exist a space inside the first interconnection 60.

The two first coupling terminals 61 are provided one-on-one to the two first interconnections 60. Each of the first coupling terminals 61 is disposed on the first surface 313, and is coupled to one end of corresponding one of the first interconnections 60. Further, the two electrically-conductive bumps 63 are provided one-on-one to the two first coupling terminals 61. One of the two electrically-conductive bumps 63 is coupled to the XG terminal T1 shown in FIG. 2, and the other is coupled to the XD terminal T2.

The two second coupling terminals 62 are provided one-on-one to the two first interconnections 60. Each of the second coupling terminals 62 is disposed on the surface of the circuit 20, and is coupled to the other end of corresponding one of the first interconnections 60. Further, each of the second coupling terminals 62 is electrically coupled to the circuit 20. Therefore, the vibrator element 10 and the circuit 20 are electrically coupled to each other via the first coupling terminals 61, the second coupling terminals 62, the electrically-conductive bumps 63, and the first interconnections 60.

The material of the first coupling terminals 61 and the second coupling terminals 62 is metal such as aluminum, copper, or tungsten, and an alloy of the metal. The material of the electrically-conductive bumps 63 is metal such as gold (Au), silver (Ag), or copper, and an alloy of the metal.

The two second interconnections 70 are provided one-on-one to the two second through holes 316. The second interconnections 70 are each a through electrode for electrically coupling the inductor 40 described later and the circuit 20 to each other. Each of the second interconnections 70 is isolated from the first substrate 311 with the first oxidized film 312.

As the material of the second interconnections 70, there can be cited metal such as aluminum, copper, or tungsten, and an alloy of the metal. It should be noted that the second interconnections 70 can be formed of a single material, or can also be formed of a plurality of materials. Further, it is possible for the second interconnections 70 to be a stacked body formed of a plurality of types of metal films. Further, although the second interconnections 70 are each a rod-like member for filling corresponding one of the second through holes 316 in the example shown in FIG. 3, it is possible for each of the second interconnections 70 to be a film formed along an inside wall surface of the base substrate 31 constituting the second through hole 316. When the second interconnection 70 is that film, there can exist a space inside the second interconnection 70.

The two first terminals 71 described later are provided one-on-one to the two second interconnections 70. Each of the first terminals 71 is electrically coupled to the inductor 40 described later. Further, the two second terminals 72 are provided one-on-one to the two second interconnections 70. Each of the second terminals 72 is disposed on the surface of the circuit 20, and is coupled to corresponding one of the second interconnections 70. Further, each of the second terminals 72 is electrically coupled to the circuit 20. Therefore, the inductor 40 and the circuit 20 are electrically coupled to each other via the first terminals 71, the second terminals 72, and the second interconnections 70.

The material of the second terminals 72 is metal such as aluminum, copper, or tungsten, and an alloy of the metal.

As shown in FIG. 3, the lid body 32 is located at the Z1 direction side of the base substrate 31. The lid body 32 is a member shaped like a flat plate having a first recess 320. The first recess 320 is a recess provided to a surface of the lid body 32. The vibrator element 10 is housed in the first recess 320. It should be noted that the lid body 32 and the vibrator element 10 are separated from each other.

The lid body 32 has a second substrate 321 and a second oxidized film 322. The second substrate 321 is formed of a semiconductor substrate such as a silicon substrate. Further, at the Z2 direction side of the second substrate 321, there is disposed the second oxidized film 322. The second oxidized film 322 makes contact with the second substrate 321. The second oxidized film 322 is a film formed of silicon oxide. It should be noted that it is possible to take the second oxidized film 322 as a part of the second substrate 321.

The lid body 32 has a bonding surface 325. The bonding surface 325 is a surface opposed to the base substrate 31, and is a part except the first recess 320 out of the surface at the Z2 direction side of the lid body 32. The bonding surface 325 is used for bonding the base substrate 31 and the lid body 32 to each other.

Figure 5:
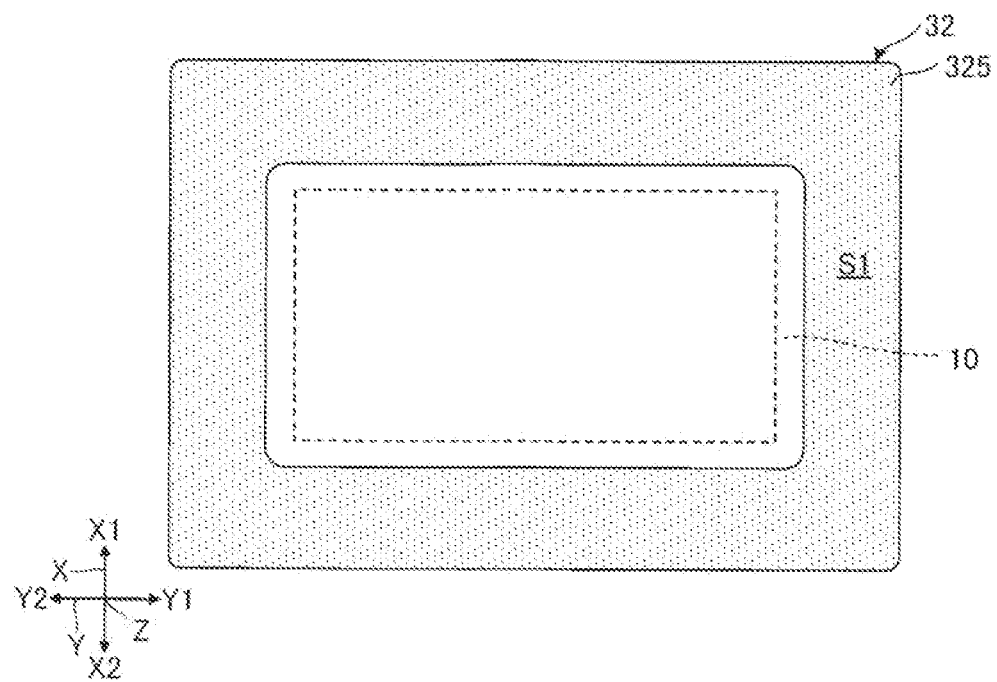
FIG. 5 is a plan view of a lid body shown in FIG. 3.

FIG. 5 is a plan view of the lid body 32 shown in FIG. 3, and is a diagram of the lid body 32 viewed toward the Z1 direction. It should be noted that in FIG. 5, the vibrator element 10 is represented by a dotted line in order to make the arrangement of the lid body 32 and the vibrator element 10 easy to understand.

As shown in FIG. 5, the bonding surface 325 has a frame-like shape surrounding the vibrator element 10 in the plan view. The width of the bonding surface 325 is not particularly limited, but is, for example, no smaller than 50 µm. When the width of the bonding surface 325 is in the range described above, it is possible to make the bonding strength between the base substrate 31 and the lid body 32 sufficiently high. Therefore, it is possible to sufficiently ensure the airtightness of the inside of the container 30.

As shown in FIG. 3, the container 30 has a bonding area S1 for bonding the base substrate 31 and the lid body 32 to each other. The bonding area S1 includes parts of the first surface 313 and the bonding surface 325 making a contribution to the bonding between the base substrate 31 and the lid body 32. The distance between the base substrate 31 and the lid body 32 in the bonding area S1 is shorter than the distance between the base substrate 31 and the lid body 32 in an area of the container 30 where the vibrator element 10 is disposed. More specifically, the bonding area S1 includes a part of the first surface 313 opposed to the bonding surface 325, and the bonding surface 325. Further, the bonding area S1 can include a space between the first surface 313 and the bonding surface 325, or can also include a part which is not bonded. In the bonding area S1, there is disposed a bonding member for bonding the base substrate 31 and the lid body 32 to each other. The first shield 51 and the second shield 52 described later each correspond to the bonding member.

As shown in FIG. 5, the shape in the plan view of the bonding surface 325 is the frame-like shape surrounding the vibrator element 10. Therefore, the bonding area S1 is an area having a frame-like shape surrounding the vibrator element 10 in the plan view. In other words, the bonding area S1 is located outside the vibrator element 10 in the plan view. It should be noted that in FIG. 5, a dot pattern is provided to the bonding area S1 so as to make the shape in the plan view of the bonding area S1 easy to understand.

Figure 6:
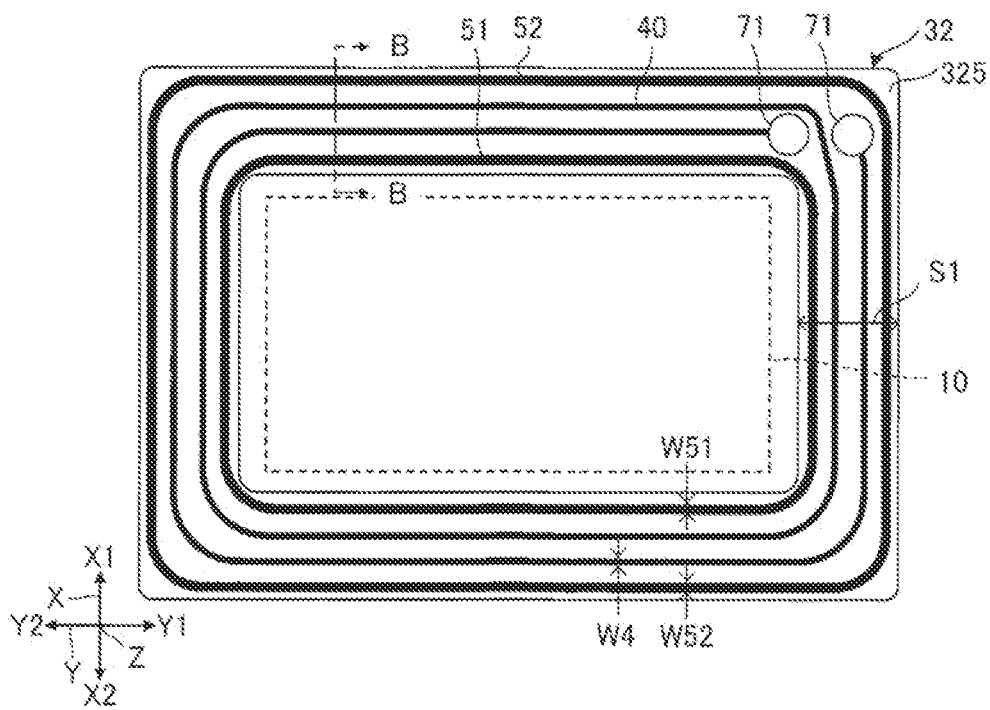
FIG. 6 is a plan view showing an inductor, a first shield, and a second shield shown in FIG. 3.

FIG. 6 is a plan view showing the inductor 40, the first shield 51, and the second shield 52 shown in FIG. 3. As shown in FIG. 6, in the bonding area S1, there are disposed the inductor 40, the two first terminals 71, the first shield 51, and the second shield 52.

The inductor 40 is electrically coupled to the circuit 20, and constitutes a part of the circuit described above. For example, the inductor 40 is provided to the PLL circuit 204 shown in FIG. 2. As shown in FIG. 6, the shape of the inductor 40 is a spiral shape in the plan view. Specifically, the inductor 40 is wound double around the vibrator element 10 in the plan view. Therefore, the inductor 40 surrounds the vibrator element 10 in the plan view. Therefore, the inductor 40 does not overlap the vibrator element 10 in the plan view.

Further, as shown in FIG. 3 and FIG. 6, the inductor 40 is disposed on the bonding surface 325. More specifically, as shown in FIG. 3, the inductor 40 makes contact with the lid body 32, but does not make contact with the base substrate 31. Therefore, a gap exists between the inductor 40 and the base substrate 31. Further, the inductor 40 is separated from the circuit 20.

As shown in FIG. 6, one of the two first terminals 71 is coupled to one end of the inductor 40, and the other of the two first terminals 71 is coupled to the other end of the inductor 40. For example, one of the two first terminals 71 is an input side, and the other is an output side. Further, as shown in FIG. 3, each of the first terminals 71 makes contact with the base substrate 31 and the lid body 32.

The material of the inductor 40 and the first terminals 71 is metal such as aluminum, copper, or tungsten, and an alloy of the metal. It should be noted that each of the inductor 40 and the first terminals 71 can be formed of a single material, or can also be formed of a plurality of materials. Further, it is possible for each of the inductor 40 and the first terminals 71 to be a stacked body formed of a plurality of types of metal films. Further, the inductor 40 and the first terminals 71 are formed by, for example, a sputtering process, an evaporation process, a plating process, or a printing process.

As shown in FIG. 6, each of the first shield 51 and the second shield 52 is located outside the vibrator element 10 in the plan view. Each of the first shield 51 and the second shield 52 is a guard ring shaped like a ring surrounding the vibrator element 10 in the plan view. The potential of each of the first shield 51 and the second shield 52 is a constant potential such as a ground potential. It should be noted that the first shield 51 and the second shield 52 are isolated from the inductor 40.

As shown in FIG. 3, each of the first shield 51 and the second shield 52 makes contact with the base substrate 31 and the lid body 32. Further, as shown in FIG. 6, the first shield 51 and the second shield 52 are disposed separately from each other. Between the first shield 51 and the second shield 52, there is disposed the inductor 40 in the plan view.

As shown in FIG. 6, the first shield 51 is located inside the inductor in the plan view. Therefore, the first shield 51 is disposed between the inductor 40 and the vibrator element 10 in the plan view. Since such a first shield 51 exists, it is possible to reduce the noise entering the first terminals 71 from the vibrator element 10 side.

Further, the second shield 52 is located outside the inductor 40 in the plan view. Therefore, it is possible to prevent the inductor 40 from being externally affected. Specifically, for example, it is possible to suppress the possibility that the inductor 40 erodes due to the external moisture.

The material of each of the first shield 51 and the second shield 52 is, for example, a material difficult to oxidize. Specifically, the material of each of the first shield 51 and the second shield 52 is metal such as gold, copper, tantalum (Ta), titanium (Ti), or platinum (Pt), and an alloy of the metal. It should be noted that each of the first shield 51 and the second shield 52 can be formed of a single material, or can also be formed of a plurality of materials. Further, it is possible for each of the first shield 51 and the second shield 52 to be a stacked body formed of a plurality of types of metal films. When the stacked body is adopted, the layer of a material difficult to oxidize is preferably located at the outermost layer. For example, as the stacked body, there can be cited a stacked body made of Ti/Au, and a stacked body made of TiW/Cu/Au.

The first shield 51 and the second shield 52 are formed by, for example, a sputtering process, an evaporation process, a plating process, or a printing process.

Each of a width W51 of the first shield 51 and a width W52 of the second shield 52 is larger than, for example, a width W4 of the inductor 40. It should be noted that the width W51 and the width W52 can be no larger than the width W4. Further, the width W51 and the width W52 can be equal to each other, or can also be different from each other. Each of the width W51 and the width W52 is not particularly limited, but is, for example, no smaller than 1 µm.

As shown in FIG. 3, each of a height T51 of the first shield 51 and a height T52 of the second shield 52 is larger than, for example, a height T4 of the inductor 40. Each of the height T51 of the first shield 51 and the height T52 of the second shield 52 is not particularly limited, but can be, for example, no smaller than 2 µm. Therefore, the distance between the base substrate 31 and the lid body is not particularly limited, but is, for example, no smaller than 2 µm.

Further, the first shield 51 and the second shield 52 are each a bonding member for bonding the base substrate 31 and the lid body 32 to each other. Specifically, due to the atomic diffusion bond between the first shield 51 and the second shield 52, the base substrate 31 and the lid body 32 are coupled to each other via the first shield 51 and the second shield 52.

The inductor 40 described hereinabove is separated from the circuit 20, and is disposed in the container 30. Therefore, it is possible to omit the arrangement place for the inductor 40 in the circuit 20. Therefore, it is possible to reduce the size of the circuit 20 compared to when the inductor 40 is incorporated in the circuit 20. Further, the inductor 40 is disposed in the container 30 for housing the vibrator element 10. Therefore, even when the inductor 40 is separated from the circuit 20, it is not required to separately prepare the arrangement place for arranging the inductor 40. Therefore, since it is possible to achieve the reduction in size of the circuit 20, it is possible to achieve the reduction in size of the vibrator device 100.

Further, since the inductor 40 is separated from the circuit 20, it is possible to avoid the problem of the crosstalk and the arrangement of the interconnections in the circuit 20. Therefore, there is avoided the problem that the arrangement of the inductor 40 in the circuit 20 is limited. Therefore, by separating the inductor 40 from the circuit 20, the limitation in arrangement place of the inductor 40 is reduced compared to when the inductor 40 is incorporated in the circuit 20.

Further, the inductor 40 does not overlap the vibrator element 10 in the plan view as described above. Therefore, the magnetic field generated by an electrical current flowing through the inductor 40 is difficult to be blocked by an electrode provided to the vibrator element 10. Therefore, the deterioration in Q-value of the inductor 40 is reduced. Therefore, by disposing the inductor 40 in the container 30 so as not to overlap the vibrator element 10 in the plan view, it is possible to achieve reduction in size of the vibrator device 100 while preventing the deterioration in characteristic of the vibrator device 100.

In the present embodiment, as described above, the inductor 40 is disposed in the bonding area S1 provided to the container 30. By disposing the inductor 40 in the bonding area S1, it is possible to surely avoid the overlap between the inductor 40 and the vibrator element 10 in the plan view, and at the same time, there is no need to separately provide the arrangement place for the inductor 40. Therefore, by disposing the inductor 40 in the bonding area S1, it is possible to effectively prevent the vibrator device 100 from growing in size even when using an existing container.

Further, as described above, in the base substrate in the container 31, there are disposed the second interconnections 70 penetrating from one of the first surface 313 and the second surface 314 toward the other. The second interconnections 70 each couple the inductor 40 and the circuit 20 electrically to each other. Since the second interconnections 70 penetrating the base substrate 31 are provided, it is possible to achieve the reduction in size of the vibrator device 100 compared to when the interconnections for electrically coupling the inductor 40 and the circuit 20 to each other are disposed outside the base substrate 31.

Further, as described above, the vibrator element 10 is provided to the base substrate 31, and the lid body 32 has the first recess 320 in which the vibrator element is housed.

Therefore, it is possible to achieve the reduction in size of the vibrator device 100 with a simple configuration.

Further, the first substrate 311 of the base substrate 31 and the second substrate 321 of the lid body 32 are each a semiconductor substrate. Therefore, it is easy to process the base substrate 31 and the lid body 32 compared to when the base substrate 31 and the lid body 32 are made of, for example, quartz crystal. Therefore, it is easy to form the container 30 which is small in size and is high in definition. Further, since the first substrate 311 is the semiconductor substrate, it is possible to dispose the circuit 20 so as to have contact with the first substrate 311. From another viewpoint, since the first substrate 311 is the semiconductor substrate, the first substrate 311 and the circuit 20 constitute an IC board. Therefore, the base substrate 31 as a part of the container 30 constitutes a part of the IC board. Therefore, it is possible to achieve the reduction in size of the vibrator device 100 compared to when the container 30 is not a part of the IC board. Therefore, it is possible to achieve the reduction in size of the vibrator device 100 compared to when the circuit 20 is coupled to the base substrate 31 via, for example, bumps.

Further, the base substrate 31 and the lid body 32 are bonded to each other with the first shield 51 and the second shield 52. Therefore, it is omitted that the bonding member for bonding the base substrate 31 and the lid body 32 to each other is additionally prepared. Therefore, it is omitted to additionally prepare a space for disposing the bonding member. Therefore, it is possible to achieve the reduction in size of the vibrator device 100 compared to when the bonding member is provided.

1A-4. Method of Manufacturing Vibrator Device 100

Figure 7:
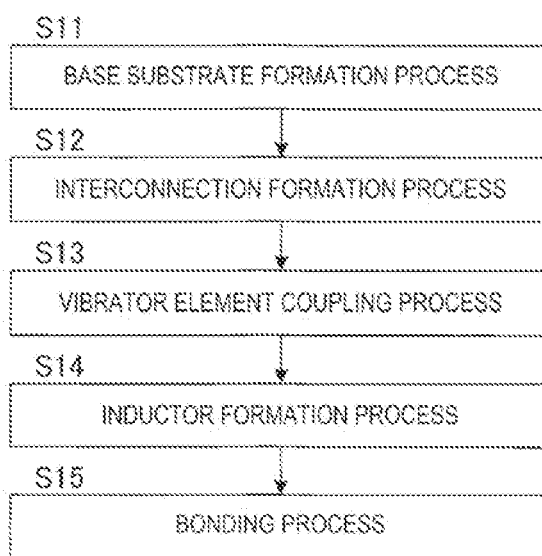
FIG. 7 is a diagram showing a flow of a method of manufacturing the vibrator device according to the first embodiment.

FIG. 7 is a diagram showing a flow of a method of manufacturing the vibrator device 100 according to the first embodiment. As shown in FIG. 7, the method of manufacturing the vibrator device 100 has a base substrate formation process S11, an interconnection formation process S12, a vibrator element coupling process S13, an inductor formation process S14, and a bonding process S15. It should be noted that the inductor formation process S14 is only required to be performed before the bonding process S15, and is not required to be performed after the vibrator element coupling process S13. The method of manufacturing the vibrator device 100 will hereinafter be described in series.

Figure 8:
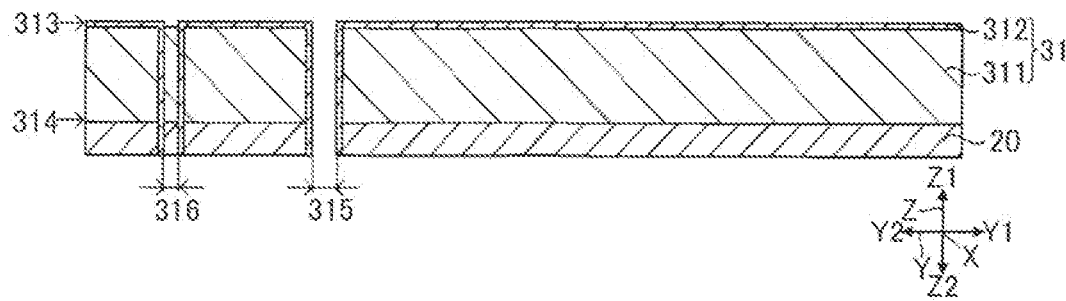
FIG. 8 is a cross-sectional view for explaining a base substrate formation process.

FIG. 8 is a cross-sectional view for explaining the base substrate formation process S11. First, in the base substrate formation process S11, as shown in FIG. 8, there is formed the base substrate 31 on which the circuit 20 is stacked. Specifically, for example, by forming the circuit 20 on the surface of the semiconductor substrate, the IC board is formed. Then, a plurality of holes is provided to the IC board. The plurality of holes is formed by a dry etching process using, for example, inductive coupling plasma. Subsequently, the first oxidized film 312 is formed on an opposite surface to the circuit 20 of the first substrate 311, and inside the plurality of holes. The first oxidized film 312 is formed using, for example, a vapor-phase deposition method or a thermal oxidation process. Due to the process described above, the base substrate 31 having the first through holes 315 and the second through holes 316 is obtained.

Figure 9:
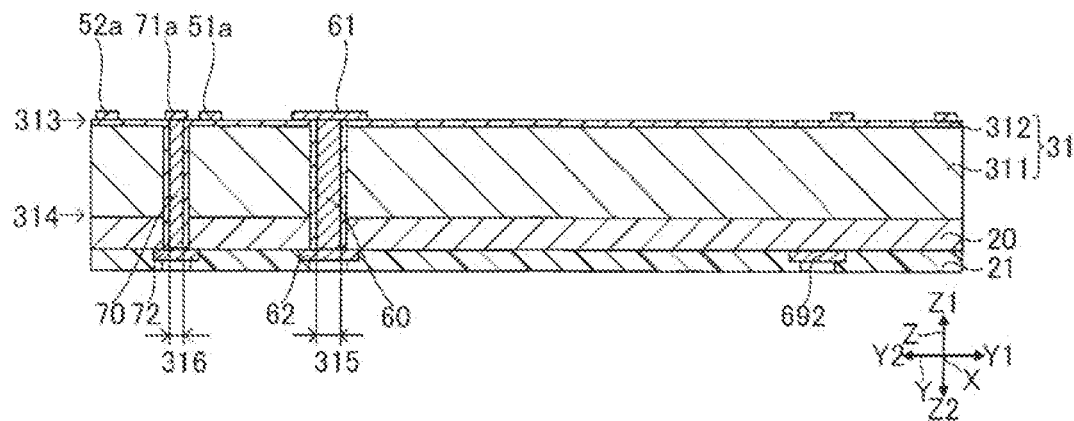
FIG. 9 is a cross-sectional view for explaining an interconnection formation process.

FIG. 9 is a cross-sectional view for explaining the interconnection formation process S12. The interconnection formation process S12 has a first process of forming the first interconnections 60 and the second interconnections 70, a second process of forming the second coupling terminals 62, the second terminals 72, the VDD terminal 691, the VSS terminal 692, the control terminal 693, and the output terminal 694, and a third process of forming the first coupling terminals 61, a metal part 51*a*, a metal part 52*a*, and two terminal parts 71*a*. It should be noted that although in the following description, the first process, the second process, and the third process are performed in this order, the order of the first process, the second process, and the third process is not limited thereto. Further, these processes can be performed at the same time. Further, for example, it is possible to perform the first process and the third process at the same time, and then perform the second process.

In the first process, the first interconnections and the second interconnections 70 are formed.

Specifically, for example, an electrically-conductive material having electrical conductivity is disposed on the first surface 313, inside the first through holes 315, and inside the second through holes 316. The electrically-conductive material is formed using, for example, an evaporation process such as a vapor-phase epitaxial method, a sputtering process, a printing process or a plating process. Subsequently, a part of the electrically-conductive material disposed on the first 313 is removed by a variety of types of patterning method. Thus, the first interconnections 60 and the second interconnections 70 are formed.

In the second process, an electrically-conductive film having electrical conductivity is formed on the second surface 314 of the base substrate 31 using substantially the same method as in the first process, and then the electrically-conductive film is patterned. Thus, the second coupling terminals 62, the second terminals 72, and the VSS terminal 692 are formed. On this occasion, the VDD terminal 691, the control terminal 693, and the output terminal 694 are also formed although not shown in FIG. 9. Further, after forming these terminals, the passivation film 21 is formed.

In the third process, an electrically-conductive film having electrical conductivity is formed on the first surface 313 of the base substrate 31 using substantially the same method as in the first process, and then the electrically-conductive film is patterned. Thus, the first coupling terminals 61, the metal part 51*a*, the metal part 52*a*, and the two terminal parts 71*a* are formed. It should be noted that illustration of one of the two terminal parts 71*a* is omitted in FIG. 9. Further, the first coupling terminals 61, the metal part 51*a*, the metal part 52*a*, and the terminal parts 71*a* can be formed at the same time, but are not required to be formed at the same time. For example, it is possible to form the metal part 51*a*, the metal part 52*a*, and the terminal parts 71*a* after forming the first coupling terminals 61.

Figure 10:
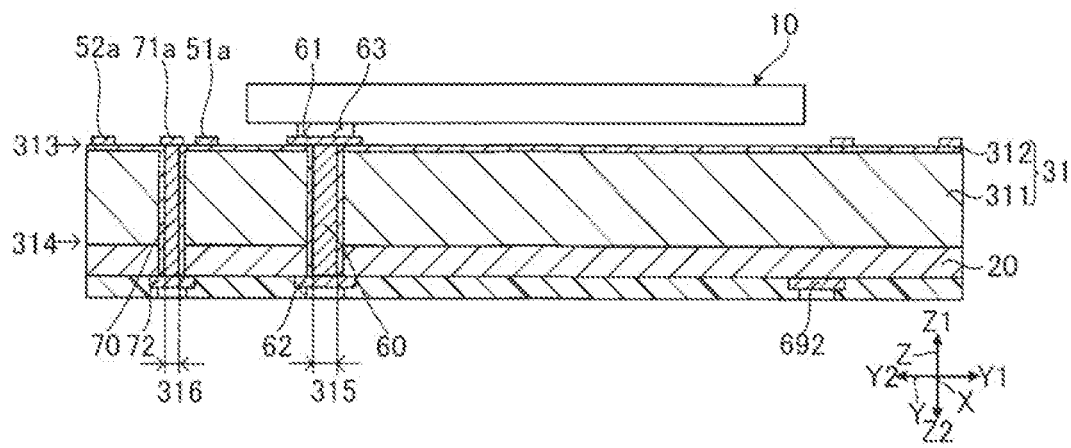
FIG. 10 is a cross-sectional view for explaining a vibrator element coupling process.

FIG. 10 is a cross-sectional view for explaining the vibrator element coupling process S13. In the vibrator element coupling process S13, the vibrator element 10 is electrically coupled to the first interconnections 60 via the electrically-conductive bumps 63 as shown in FIG. 10. The electrically-conductive bumps 63 are formed using, for example, an electroless plating process.

Figure 11:
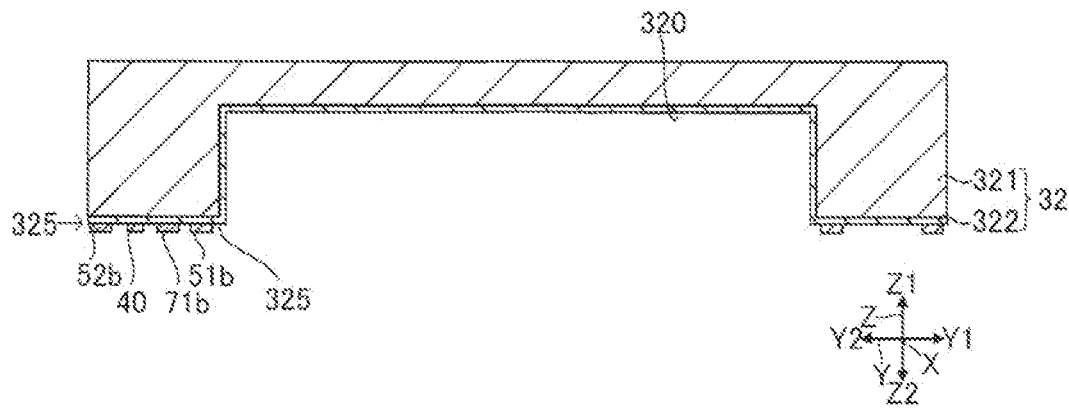
FIG. 11 is a cross-sectional view for explaining an inductor formation process.

FIG. 11 is a cross-sectional view for explaining the inductor formation process S14. In the inductor formation process S14, a metal part 51*b*, a metal part 52*b*, two terminal parts 71*b*, and the inductor 40 are formed in addition to the lid body 32 as shown in FIG. 11. It should be noted that illustration of one of the two terminal parts 71*b* is omitted in FIG. 11.

Specifically, first, by providing a recess to the semiconductor substrate, the second substrate 321 is formed. The recess is formed by a dry etching process using, for example, inductive coupling plasma. Then, the second oxidized film 322 is formed on the surface of the second substrate 321 provided with the recess. The second oxidized film 322 is formed using, for example, a vapor-phase deposition method or a thermal oxidation process. Thus, the lid body 32 having the bonding surface 325 and the first recess 320 is obtained.

Subsequently, an electrically-conductive film having electrical conductivity is formed on the bonding surface 325 of the lid body 32 using substantially the same method as in the third process described above, and then the electrically-conductive film is patterned. Thus, the metal part 51b, the metal part 52b, the terminal parts 71b, and the inductor 40 are formed. It should be noted that the metal part 51b, the metal part 52b, the terminal parts 71b, and the inductor 40 can be formed at the same time, but is not required to be formed at the same time. For example, it is possible to form at least one of the metal part 51b, the metal part 52b, the terminal parts 71b, and the inductor 40, and then form the rest.

Figure 12:
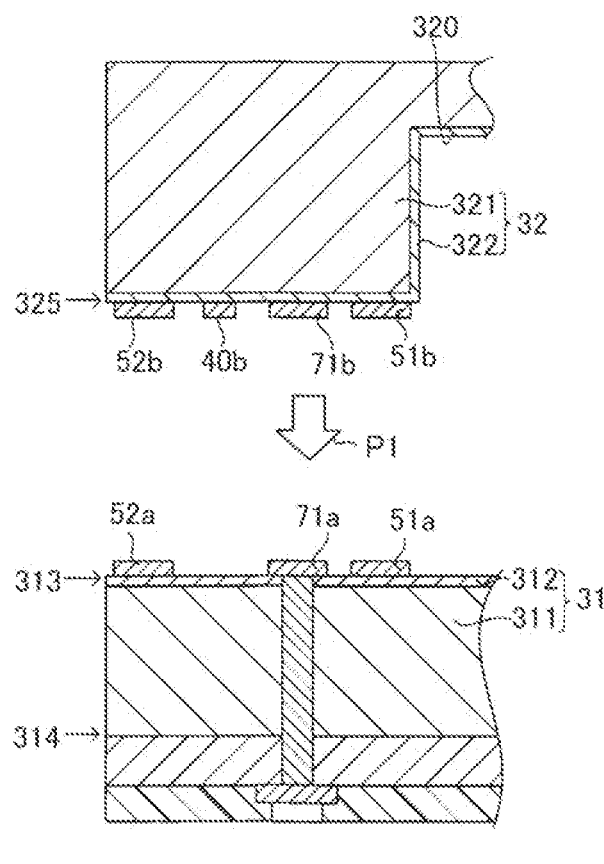
FIG. 12 is a cross-sectional view for explaining a bonding process.

FIG. 12 is a cross-sectional view for explaining the bonding process S15. In the bonding process S15, the base substrate 31 and the lid body 32 are bonded to each other. Specifically, by moving the lid body 32 in, for example, a direction of an arrow P1 in the state in which the first surface 313 and the first recess 320 are opposed to each other, the lid body 32 and the base substrate 31 come closer to each other. Subsequently, by bonding the metal part 51a and the metal part 51b to each other, and bonding the metal part 52a and the metal part 52b to each other, the base substrate 31 and the lid body 32 are bonded to each other.

The bonding between the metal part 51a and the metal part 51b is preferably atomic diffusion bonding. Similarly, the bonding between the metal part 52a and the metal part 52b is preferably atomic diffusion bonding. In the atomic diffusion bonding, the surface of each of the metal part 51a, the metal part 51b, the metal part 52a, and the metal part 52b is activated by ion irradiation with an FAB (Fast Atom Beam) gun or the like.

By using the atomic diffusion bonding, it is possible to indirectly bond the base substrate 31 and the lid body 32 to each other without altering the base substrate 31 and the lid body 32. Further, by using the atomic diffusion bonding, the limitation of the material of the base substrate 31 and the lid body 32 decreases. Further, the atomic diffusion bonding is preferably performed at room temperature. Thus, the bonding between the base substrate 31 and the lid body 32 can easily be performed compared to when being performed at high temperature of, for example, about 200° C., and at the same time, it is possible to prevent the alteration of the base substrate 31, the lid body 32, and the circuit elements provided to the circuit 20.

Further, a surface roughness Ra of each of the metal part 51a, the metal part 51b, the metal part 52a, and the metal part 52b is not particularly limited, but is preferably no larger than 0.5 nm, and more preferably no larger than 0.02 nm. The smaller the surface roughness becomes, the larger the number of bonding points becomes. Further, it is possible to reduce occurrence of voids. Therefore, it is possible to increase the bonding strength. Further, when the surface roughness Ra is within the preferable range described above, it is possible to further increase the bonding strength compared to when the surface roughness Ra is out of the range, and therefore, it is possible to improve the airtightness of the inside of the container 30. In addition, it is easy to process the metal part 51a, the metal part 51b, the metal part 52a, and the metal part 52b.

The material of the metal part 51a, the metal part 51b, the metal 52a, and the metal 52b is the same as the material of the first shield 51 and the second shield 52 described above.

By forming the material of the metal part 51a, the metal part 51b, the metal part 52a, and the metal part 52b from a material difficult to oxidize described above, it is possible to increase the bonding strength, and at the same time, the bonding can easily be achieved at room temperature.

Due to the processes described hereinabove, the vibrator device 100 shown in FIG. 3 is manufactured. It should be noted that when manufacturing a plurality of vibrator devices 100, there is included a segmentalizing process after the bonding process S15.

1B. Second Embodiment

A second embodiment will be described. It should be noted that in each of the following illustrations, regarding the elements substantially the same in function as those in the first embodiment, the symbols used in the description of the first embodiment are diverted, and the detailed description of each of such elements is arbitrarily omitted.

Figure 13:
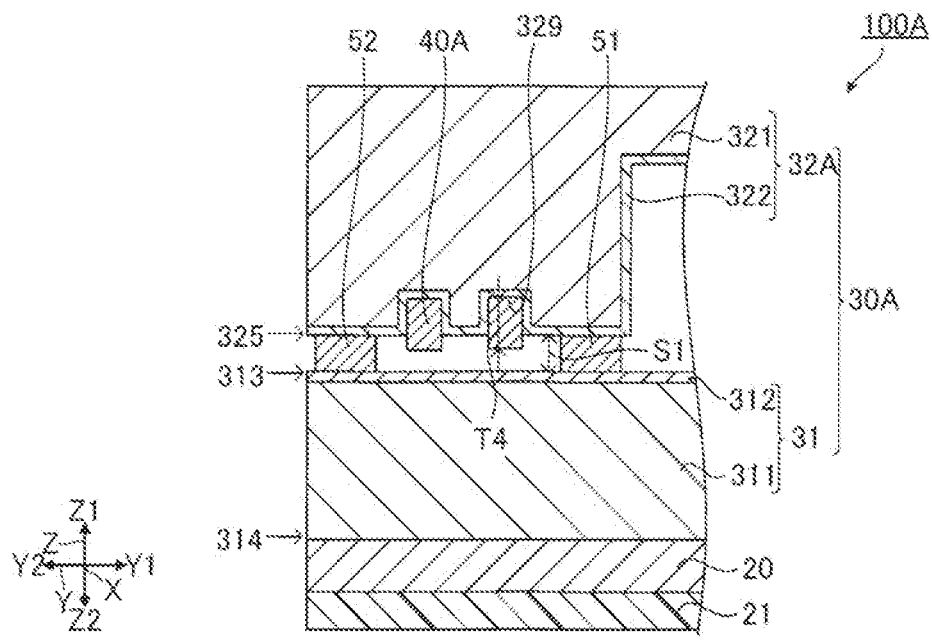
FIG. 13 is an enlarged cross-sectional view of a part of a vibrator device according to a second embodiment.

FIG. 13 is an enlarged cross-sectional view of a part of a vibrator device 100A according to the second embodiment. FIG. 13 corresponds to a cross-sectional view along the line B-B in FIG. 6. As shown in FIG. 13, a container 30A provided to the vibrator device 100A has the base substrate 31 and a lid body 32A. The container 30A in the present embodiment is substantially the same as the container 30 in the first embodiment except the fact that the lid body 32A has a second recess 329. Further, the vibrator device 100A has an inductor 40A. The inductor 40A is substantially the same as the inductor 40 according to the first embodiment except the fact that the height is different.

The second recess 329 is a recess provided to the lid body 32A. The second recess 329 can be referred to simply as a recess 329. The second recess 329 is provided to the bonding surface 325 as a part of a surface of the lid body 32A. The second recess 329 opens toward the bonding area S1. In the second recess 329, there is disposed the inductor 40A. Although not shown in the drawing, the shape in the plan view of the second recess 329 corresponds to the shape in the plan view of the inductor 40A, and is formed along the inductor 40A. The shape in the plan view of the inductor 40A is substantially the same as the shape in the plan view of the inductor 40 in the first embodiment. Therefore, although not shown in detail, the second recess 329 has a spiral shape in the plan view, and is wound double around the vibrator element 10 similarly to the inductor 40 shown in FIG. 6.

Since the lid body 32A has the second recess 329, it is possible to make the height T4 of the inductor 40A higher compared to the height T4 of the inductor 40 according to the first embodiment without making the inductor 40A have contact with the base substrate 31. Therefore, it is possible to increase the cross-sectional area of the inductor 40A without enlarging the area in the plan view of the bonding surface 325. Therefore, it is possible to achieve the reduction in size of the vibrator device 100A, and at the same time, achieve the reduction in resistance of the inductor 40A.

Figure 14:
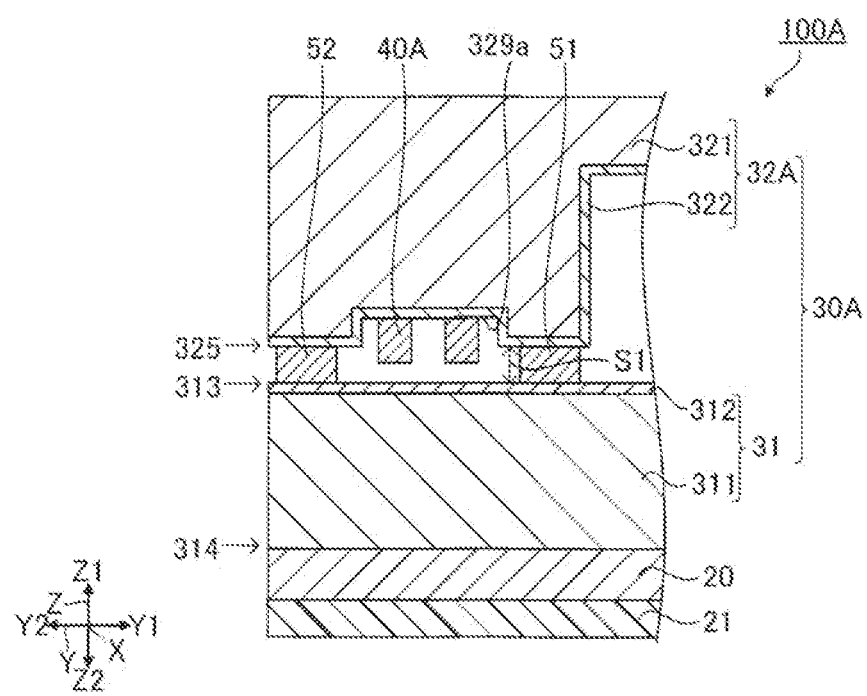
FIG. 14 is an enlarged cross-sectional view of a part of another example of the vibrator device according to the second embodiment.

FIG. 14 is an enlarged cross-sectional view of a part of another example of the vibrator device 100A according to the second embodiment. Although not shown in detail, the second recess 329 shown in FIG. 13 has a spiral shape in the plan view, but a second recess 329a shown in FIG. 14 has a ring-like shape in the plan view. In the example shown in FIG. 14, the inductor 40A which is wound double around the vibrator element 10 is disposed in the second recess 329a. The second recess 329a shown in FIG. 14 has an advantage that the second recess 329a is easier to process than the second recess 329 shown in FIG. 13.

According also to the vibrator device 100A related to the second embodiment described hereinabove, it is possible to achieve the reduction in size.

1C. Third Embodiment

A third embodiment will be described. It should be noted that in each of the following illustrations, regarding the elements substantially the same in function as those in the first embodiment, the symbols used in the description of the first embodiment are diverted, and the detailed description of each of such elements is arbitrarily omitted.

Figure 15:
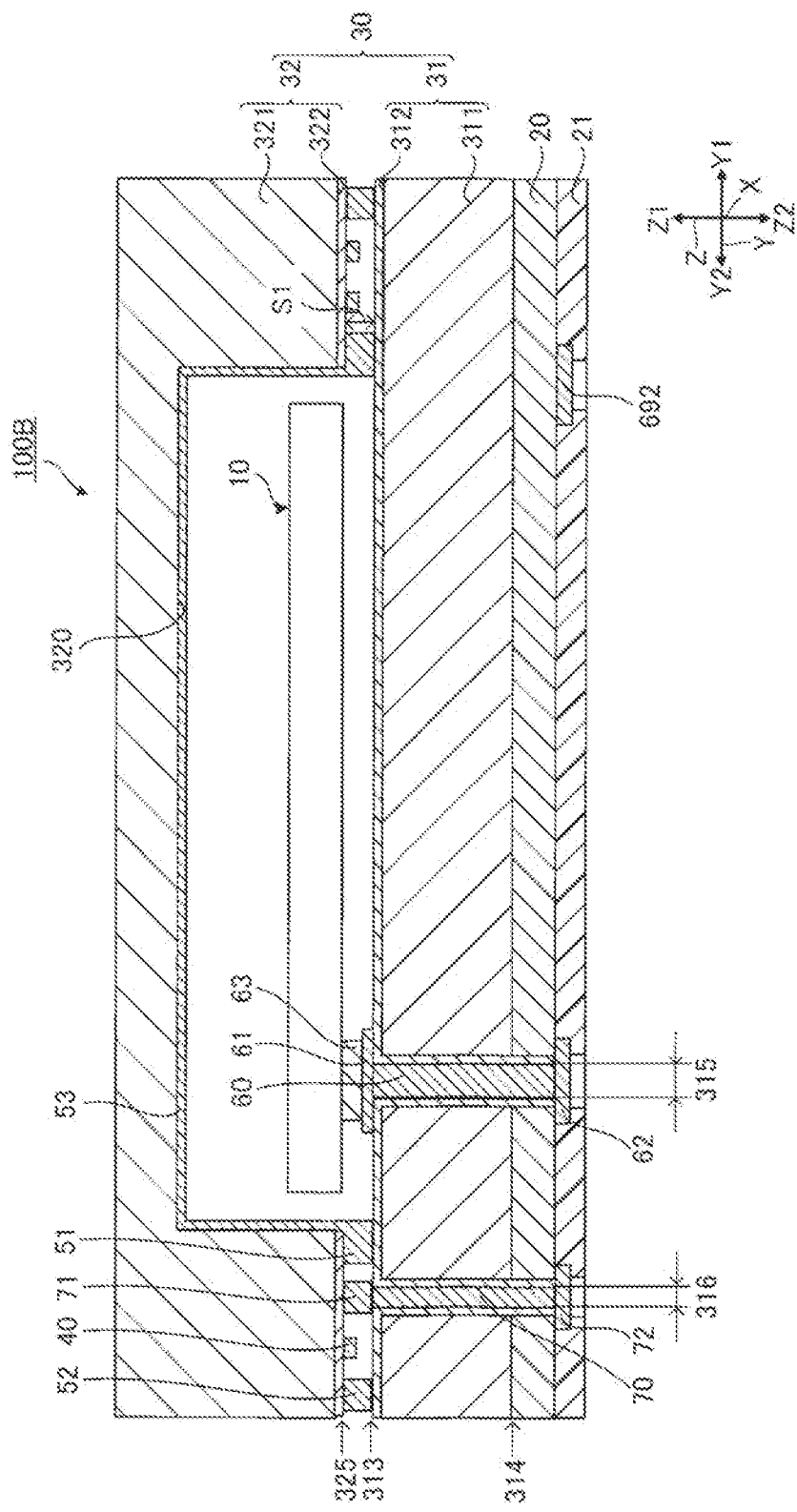
FIG. 15 is a cross-sectional view of a vibrator device according to a third embodiment.

FIG. 15 is a cross-sectional view showing a vibrator device 100B according to the third embodiment. As shown in FIG. 15, the vibrator device 100B is substantially the same as the vibrator device 100 according to the first embodiment except the fact that the vibrator device 100B has a metal layer 53.

The metal layer 53 is disposed along the first recess 320. The metal layer 53 has contact with the lid body 32, and is disposed in the entire area of the first recess 320. Further, the second oxidized film 322 does not exist between the metal layer 53 and the second substrate 321, and the metal layer 53 makes contact with the second substrate 321. Further, the metal layer 53 is coupled to the first shield 51. Therefore, the metal layer 53 and the first shield 51 are integrated with each other. It should be noted that the metal layer 53 can be separated from the first shield 51.

As the material of the metal layer 53, there can be cited metal such as gold, copper, tantalum, titanium, and platinum, and an alloy of the metal. It should be noted that the metal layer 53 can be formed of a single material, or can also be formed of a plurality of materials similarly to the first shield 51. Further, it is preferable for the material of the metal layer 53 to be substantially the same material as that of the first shield 51 since it is easy to manufacture the metal layer 53.

Since such a metal layer 53 exists, it is possible to improve the shield performance with respect to the vibrator element 10 compared to when the metal layer 53 does not exist. Therefore, compared to when the metal layer 53 does not exist, it is possible to suppress the deterioration of the characteristic of the vibrator device 100.

According also to the vibrator device 100B related to the third embodiment described hereinabove, it is possible to achieve the reduction in size.

1D. Fourth Embodiment

A fourth embodiment will be described. It should be noted that in each of the following illustrations, regarding the elements substantially the same in function as those in the first embodiment, the symbols used in the description of the first embodiment are diverted, and the detailed description of each of such elements is arbitrarily omitted.

Figure 16:
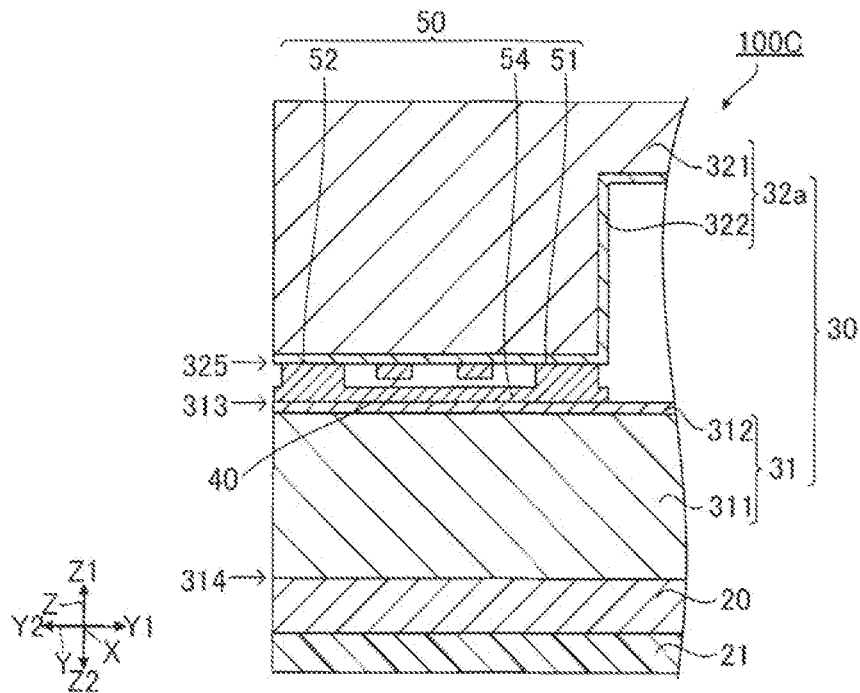
FIG. 16 is an enlarged cross-sectional view of a part of a vibrator device according to a fourth embodiment.

FIG. 16 is an enlarged cross-sectional view of a part of a vibrator device 100C according to the fourth embodiment. The vibrator device 100C according to the present embodiment is different from the vibrator device 100 according to the first embodiment in that the vibrator device 100C has a shield member 50 including the first shield 51 and the second shield 52.

As shown in FIG. 16, the shield member 50 provided to the vibrator device 100C includes the first shield 51, the second shield 52, and a coupling part 54. The coupling part 54 couples the first shield 51 and the second shield 52 to each other. The coupling part 54 is disposed on the base substrate 31. Although not shown in detail, the coupling part 54 is disposed at a place except a part where the first terminals 71 on the first surface 313 is disposed in the bonding area S1. Therefore, the shield member 50 does not make contact with the first terminals 71.

Since the vibrator device 100C has the shield member 50, it is possible to improve the shield performance of the inductor 40 and the first terminals 71 compared to the vibrator device 100 according to the first embodiment.

Figure 17:
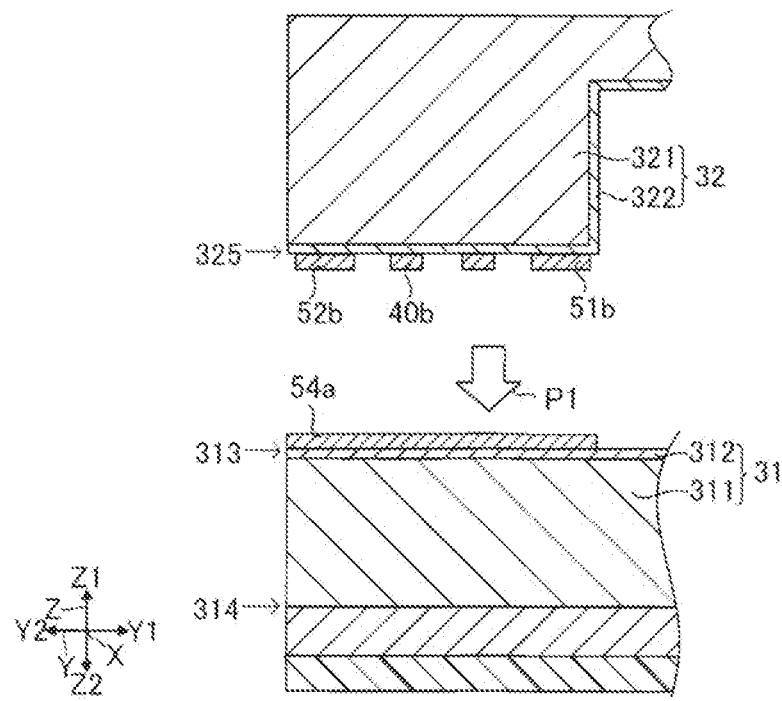
FIG. 17 is a cross-sectional view for explaining the interconnection formation process and the bonding process.

FIG. 17 is a cross-sectional view for explaining the interconnection formation process S12 and the bonding process S15. In the third process of the interconnection formation process S12, a homogenous metal part 54a is formed in a part corresponding to the bonding area S1 out of the first surface 313 as shown in FIG. 17 using substantially the same method as in the third process described above. Further, in the bonding process S15, the lid body 32 moves in, for example, the direction of the arrow P1, and each of the metal part 51b and the metal part 52b is bonded to the metal part 54a. The bonding of the metal part 51b and the metal part 52b to the metal part 54a is preferably atomic diffusion bonding.

According to the method described hereinabove, alignment of the metal part 51b and the metal part 52b to the metal part 54a is easy. Therefore, it is possible to easily bond the base substrate 31 and the lid body 32 to each other.

According also to the vibrator device 100C related to the fourth embodiment described hereinabove, it is possible to achieve the reduction in size.

1E. Fifth Embodiment

A fifth embodiment will be described. It should be noted that in each of the following illustrations, regarding the elements substantially the same in function as those in the first embodiment, the symbols used in the description of the first embodiment are diverted, and the detailed description of each of such elements is arbitrarily omitted.

Figure 18:
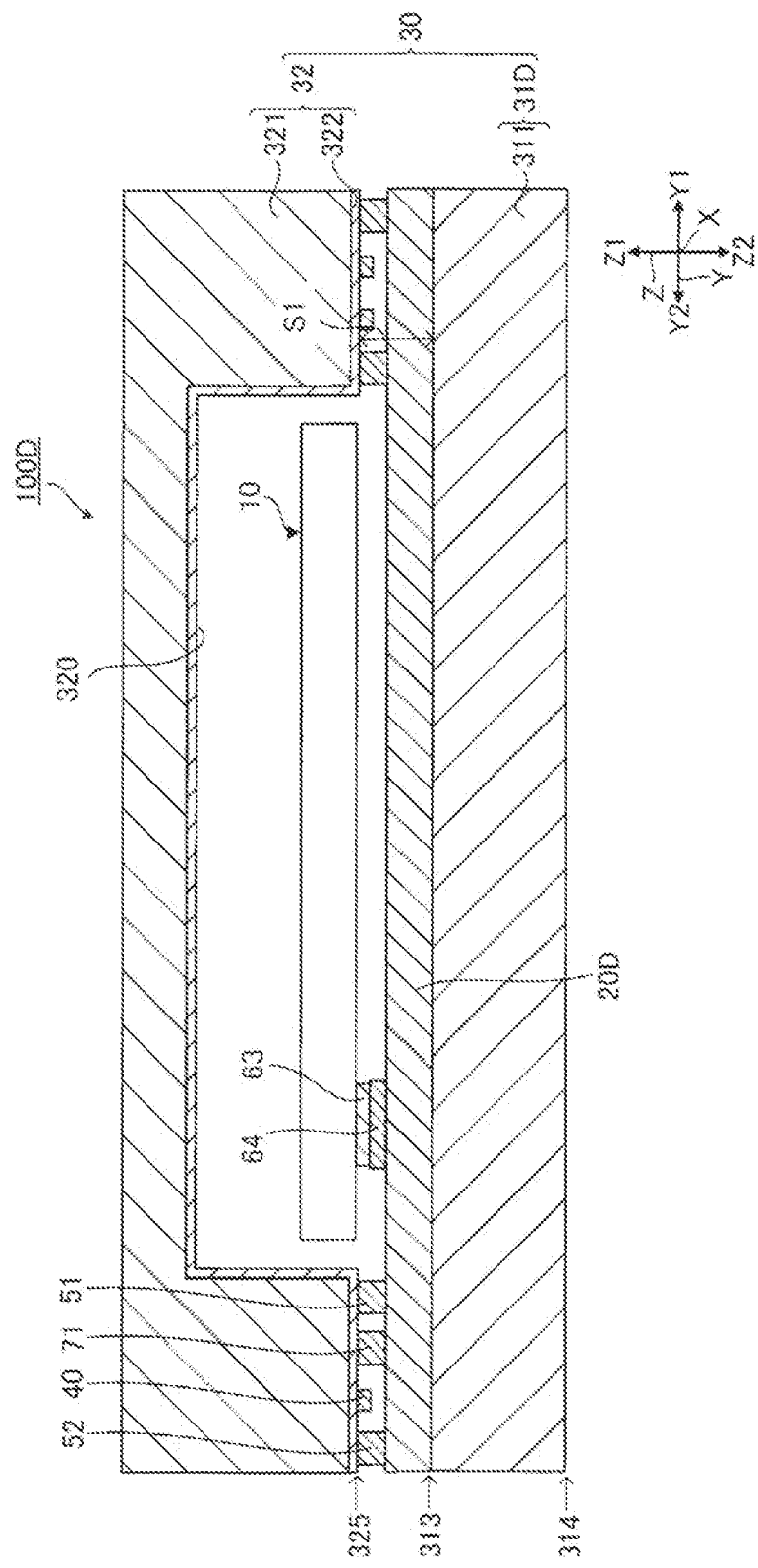
FIG. 18 is an enlarged cross-sectional view of a part of a vibrator device according to a fifth embodiment.

FIG. 18 is an enlarged cross-sectional view of a part of a vibrator device 100D according to the fifth embodiment. As shown in FIG. 16, an arrangement of a circuit 20D provided to the vibrator device 100D is different from the circuit 20 in the first embodiment.

The circuit 20D is disposed on the first surface 313 of a base substrate 31D. Therefore, the circuit 20D exists in the space inside the container 30. Since the circuit 20D is disposed on the first surface 313, it is possible to omit the first interconnections 60 and the second interconnections 70 in the first embodiment. In the present embodiment, the circuit 20D is coupled to the vibrator element 10 via third coupling terminals 64 and the electrically-conductive bumps 63. Further, the passivation film 21 is omitted. The third coupling terminals 64 are electrically coupled to the circuit 20D. The material of the third coupling terminals 64 is substantially the same as the material of the first coupling terminals 61 in the first embodiment.

Since the circuit 20D is disposed on the first surface 313, it is possible to achieve further reduction in size of the vibrator device 100D compared to when the circuit 20D is disposed on the second surface 314.

Therefore, according also to the vibrator device 100D related to the fifth embodiment described hereinabove, it is possible to achieve the reduction in size.

1F. Modified Examples

Each of the configurations illustrated hereinabove can variously be modified. Some specific configurations of the modifications which can be applied to each of the configurations described above will be illustrated below. Further, the aspect of each of the modifications described below is arbitrarily applied to each of the embodiments within a range in which mutual conflict does not occur. Therefore, for example, the aspect of the modification of the first embodiment or the second embodiment described below is arbitrarily applied to other embodiments within a range in which the mutual conflict does not occur.

Although in the first embodiment described above, the number of the inductors 40 is one, the number can also be two or more. Further, the inductor 40 has a spiral shape surrounding the vibrator element 10 in the plan view, but is not required to surround the vibrator element 10.

Figure 19:
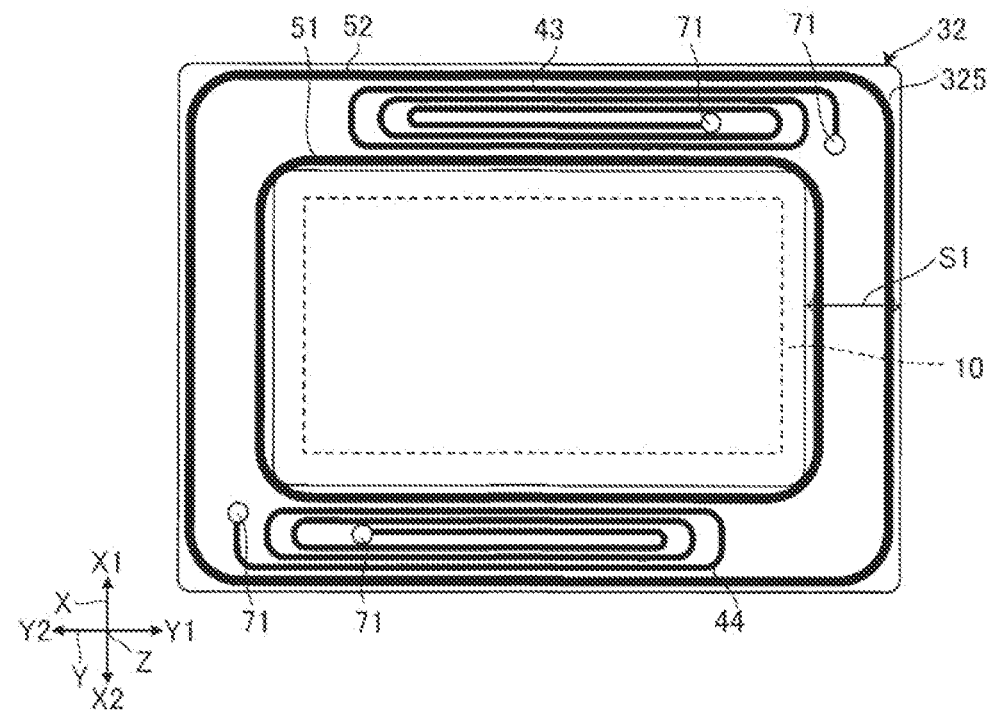
FIG. 19 is a diagram showing two inductors in a modified example.

FIG. 19 is a diagram showing inductors 43 and 44 in the modified example. As shown in FIG. 19, the inductor is located at the X1 direction side of the vibrator element 10, and the inductor 44 is located at the X2 direction side of the vibrator element 10. Each of the inductors 43 and 44 does not overlap the vibrator element 10 in the plan view. Therefore, even in the inductors 43 and 44, the deterioration in Q-value of each of the inductors 43 and 44 is reduced.

In the first embodiment described above, the center of the lid body 32 and the center of the vibrator element 10 substantially coincide with each other in the plan view, but are not required to coincide with each other in the plan view.

Figure 20:
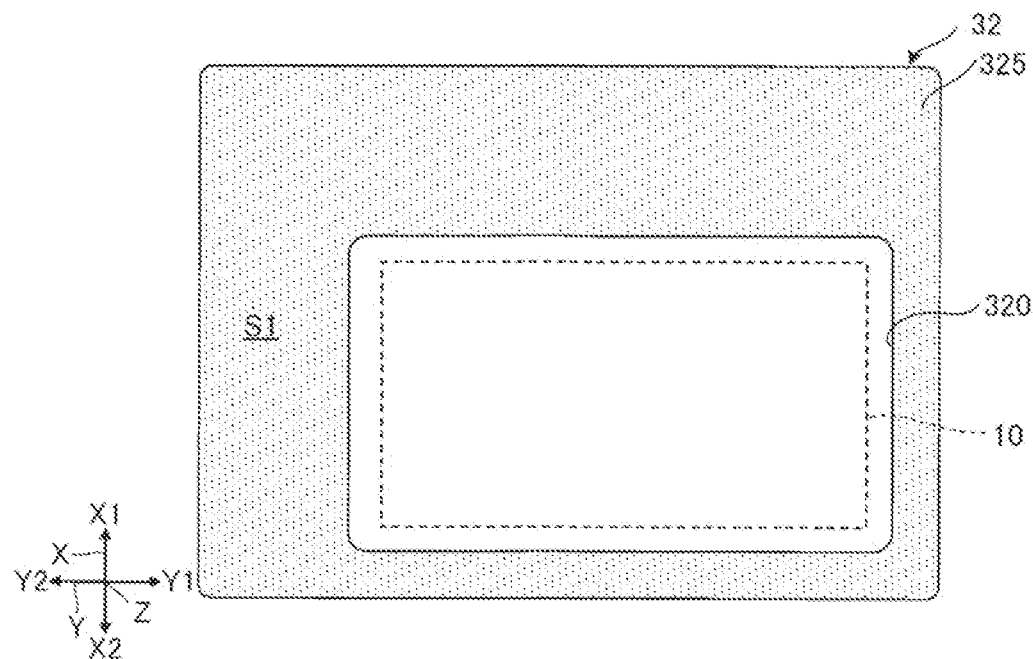
FIG. 20 is a plan view showing a lid body in another modified example.

FIG. 20 is a plan view showing the lid body 32 in another modified example. As shown in FIG. 20, the center of the lid body 32 and the center of the vibrator element 10 are not required to coincide with each other in the plan view. Therefore, the width of the bonding surface 325 is not required to be constant. Therefore, the width of the bonding area S1 is not required to be constant in the plan view.

Figure 21:
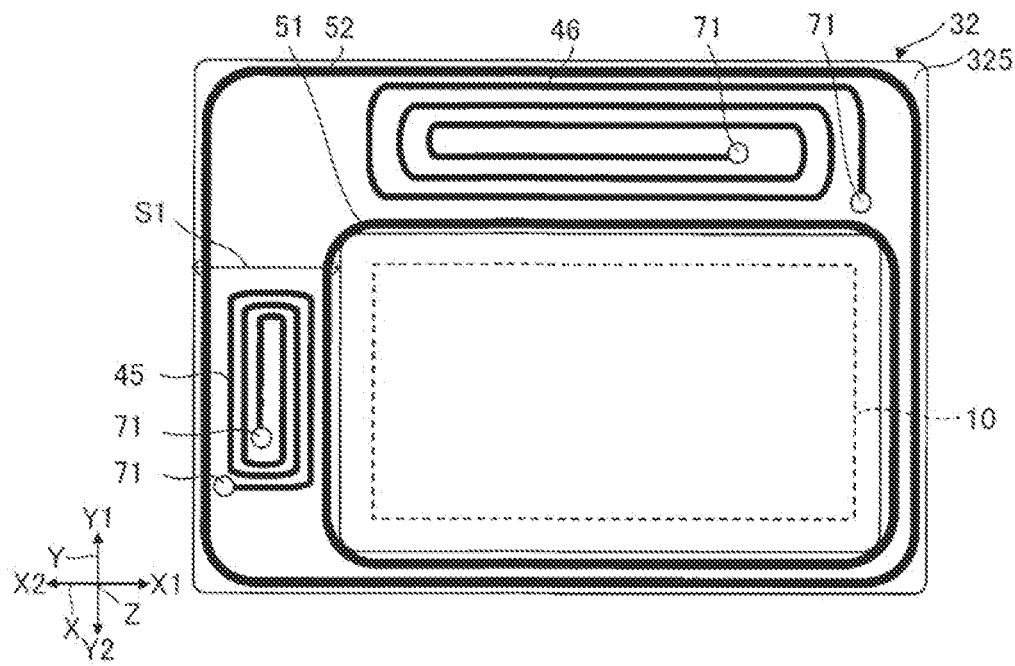
FIG. 21 is a plan view showing two inductors in another modified example.

FIG. 21 is a plan view showing two inductors 45 and 46 in another modified example. As shown in FIG. 21, the inductor 45 is located at the X2 direction side of the vibrator element 10, and the inductor 46 is located at the Y1 direction side of the vibrator element 10. Each of the inductors 45 and 46 does not overlap the vibrator element 10 in the plan view. Therefore, even in the inductors 45 and 46, the deterioration in Q-value of each of the inductors 45 and 46 is reduced.

Although in the first embodiment described above, the inductor 40 makes contact with the lid body 32, and does not make contact with the base substrate 31, it is possible for the inductor 40 to make contact with both of the lid body 32 and the base substrate 31.

Figure 22:
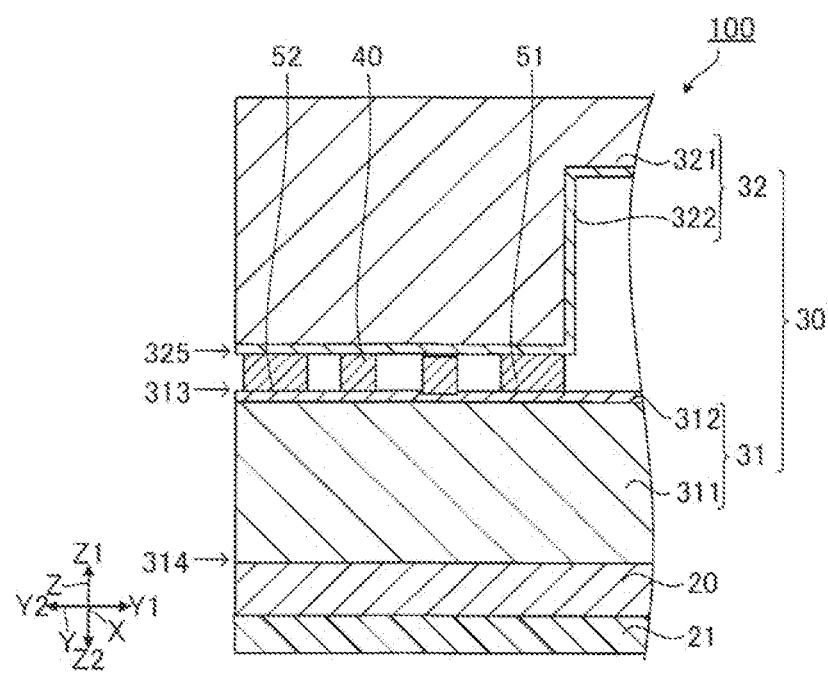
FIG. 22 is an enlarged cross-sectional view of a part of a vibrator device according to another modified example.

FIG. 22 is an enlarged cross-sectional view of a part of the vibrator device 100 according to another modified example. As shown in FIG. 22, it is possible for the inductor 40 to make contact with both of the lid body 32 and the base substrate 31.

The height T51 and the height T52 are each higher than the height T4 in the first embodiment described above, but each can be no higher than the height T4. Further, the height T51 and the height T52 are equal to each other in the first embodiment described above, but can be different from each other.

Although in the first embodiment described above, the first shield 51 and the second shield 52 are provided, it is possible to omit either one of them such as the second shield 52. Further, the first shield 51 can partially be decoupled. Similarly, the second shield 52 can partially be decoupled. Further, the base substrate 31 and the lid body 32 can be bonded to each other with other bonding members than the first shield 51 and the second shield 52.

Although in the first embodiment described above, each of the first substrate 311 and the second substrate 321 is the semiconductor substrate, it is possible for the material of the first substrate 311 and the second substrate 321 to be other materials than the semiconductor material. For example, the material of the first substrate 311 and the second substrate 321 can be ceramic, metal, or glass.

Although in the second embodiment described above, the lid body 32 has the second recess 329, it is possible for the base substrate 31 to have the second recess. For example, when the inductor 40A is provided to the base substrate 31, it is possible for the second recess to be provided to the base substrate 31. Further, the outer shape of the container 30 is not limited to the shapes shown in FIG. 1 and FIG. 3.

Although in the first embodiment described above, the inductor 40 is disposed in the bonding area S1, it is possible for the inductor 40 to be disposed at a place other than the bonding area S1 in the container 30. Therefore, the inductor can be disposed on the surface of the first member, or can also be disposed on the surface of the second member. Further, it is possible for the inductor to be embedded inside the first member or the second member.

Figure 23:
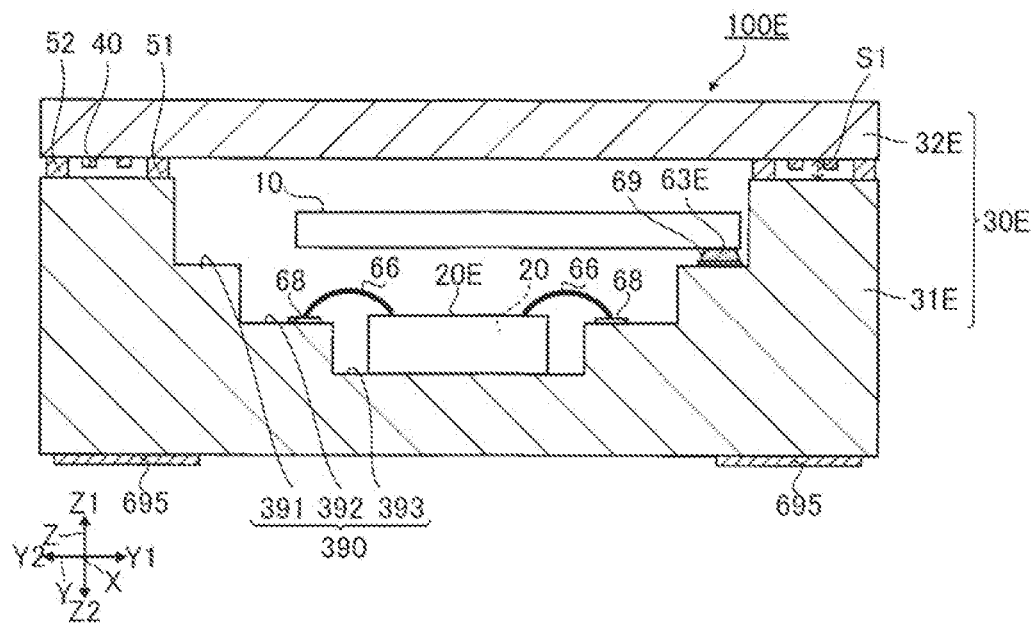
FIG. 23 is a diagram showing a vibrator device according to another modified example.

FIG. 23 is a diagram showing a vibrator device 100E according to another modified example. As shown in FIG. 23, a container 30E has a base substrate 31E as the first member, and a lid body 32E as the second member.

The shape of the lid body 32E is a flat shape. Further, the base substrate 31E has a recess 390. The recess 390 includes a recess 391, a recess 392 provided to a bottom surface of the recess 391, and a recess 393 provided to a bottom surface of the recess 392.

In a bottom part of the recess 393, there is disposed a circuit element 20E having the circuit 20. On the bottom surface of the recess 391, there is disposed the vibrator element 10 via terminals 69 and electrically-conductive bumps 63E. Further, on the bottom surface of the recess 392, there is disposed a plurality of terminals electrically coupled to the circuit element 20E via electrically-conductive wires 66. Any of the terminals 68 are electrically coupled to any of external terminals 695 via through electrodes not shown. Further, any of the terminals 68 are electrically coupled to the terminals 69 via through electrodes not shown. It should be noted that the external terminals 695 correspond respectively to the VDD terminal 691, the VSS terminal 692, the control terminal 693, and the output terminal 694 described above.

In the bonding area S1 between the base substrate 31E and the lid body 32E, there are disposed the inductor 40, the first shield 51, and the second shield 52.

The material of the lid body 32E is, for example, metal or ceramic. Further, the material of the base substrate 31E is, for example, ceramic. For example, the base substrate 31E is formed by stacking a plurality of ceramic substrates each having an opening part.

It should be noted that it is possible to dispose the inductor 40, the first shield 51, and the second shield 52 between, for example, two ceramic substrates out of the plurality of ceramic substrates constituting the base substrate 31E. In this case, one of the two ceramic substrates sandwiching the inductor 40 corresponds to the first member, and the other thereof corresponds to the second member. Further, it is possible for the inductor 40 to be disposed inside the container 30E. For example, it is possible for the inductor 40 to be disposed at a position not overlapping the vibrator element 10 in the plan view on the bottom surface of the recess 392 so as to be exposed inside the container 30E.

According also to the vibrator device 100E, it is possible to achieve the reduction in size.

Figure 24:
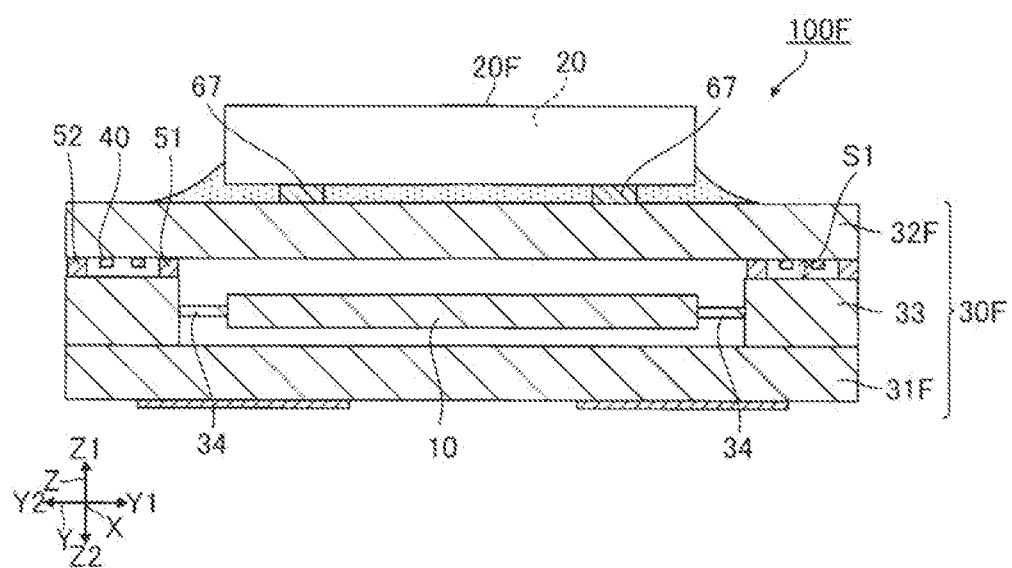
FIG. 24 is a diagram showing a vibrator device according to another modified example.

FIG. 24 is a diagram showing a vibrator device 100F according to another modified example. As shown in FIG. 24, a container 30F provided to the vibrator device 100F has a base substrate 31F, a lid body 32F, and an intermediate member 33. The intermediate member 33 is disposed between the base substrate 31F and the lid body 32F. The shape of each of the base substrate 31F and the lid body 32F is a flat shape. The shape of the intermediate member 33 is a frame-like shape, and the vibrator element is disposed inside the intermediate member 33. The vibrator element 10 is coupled to the intermediate member 33 via a plurality of connecting parts 34. The intermediate member 33, the plurality of connecting parts 34, and the vibrator element 10 are formed integrally with each other. Further, the base substrate 31F, the lid body 32F, the intermediate member 33, the plurality of connecting parts 34, and the vibrator element 10 are formed of, for example, quartz crystal.

At the Z1 direction side of the lid body 32F, there is disposed a circuit element 20F having the circuit 20. On an external surface of the circuit element 20F, there is disposed a plurality of terminals 67. Any of the terminals 67 are electrically coupled to the vibrator element 10 via through electrodes not shown and so on, and the rest are electrically coupled to the inductor 40 via through electrodes not shown and so on. Further, the circuit element 20F is coupled to the plurality of external terminals 695 via through electrodes not shown.

One of the intermediate member 33 and the lid body 32F is an illustration of the first member, and the other thereof is an illustration of the second member. In the bonding area S1 between the intermediate member 33 and the lid body 32F, there are disposed the inductor 40, the first shield 51, and the second shield 52. It should be noted that it is possible to dispose the inductor 40, the first shield 51, and the second shield 52 between the intermediate member 33 and the base substrate 31F. In this case, one of the intermediate member 33 and the base substrate 31F is an illustration of the first member, and the other thereof is an illustration of the second member.

According also to the vibrator device 100F, it is possible to achieve the reduction in size similarly to the first embodiment.

The present disclosure is not limited to each of the embodiments described above, but a variety of modifications can be provided. For example, the present disclosure includes substantially the same configuration as the configurations described in the embodiments. Substantially the same configuration denotes a configuration substantially the same in, for example, function, way, and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages or configurations capable of achieving the same object as that of the configurations explained in the description of the embodiments. Further, the present disclosure includes configurations obtained by adding a known technology to the configuration explained in the description of the embodiments. Although the present disclosure is hereinabove described based on the preferred embodiments, the present disclosure is not limited to the embodiments described above. Further, the embodiments described above can arbitrarily be combined with each other within a range where a mutual conflict does not occur.

What is claimed is:

1. A vibrator device comprising:
   a vibrator element;
   a container in which the vibrator element is housed;
   a circuit which is disposed in the container, and which overlaps the vibrator element in a plan view; and
   an inductor which is disposed in the container, which fails to overlap the vibrator element in the plan view, and which is electrically coupled to the circuit,
   wherein the container includes at least a first member and a second member, and a bonding area configured to bond the first member and the second member to each other, and the inductor is disposed in the bonding area.

2. The vibrator device according to claim 1, wherein
   the vibrator element is provided to the first member,
   the second member has a first recess in which the vibrator element is housed,
   the first member and the second member are each a semiconductor substrate, and
   the circuit is disposed so as to have contact with the first member.

3. The vibrator device according to claim 2, further comprising:
   a metal layer provided to the first recess.

4. The vibrator device according to claim 2, further comprising:
   a shield disposed in the bonding area, wherein
   the shield is disposed between the inductor and the vibrator element in the plan view.

5. The vibrator device according to claim 4, wherein
   the first member and the second member are bonded to each other with the shield.

6. The vibrator device according to claim 1, wherein
   one of the first member and the second member has a recess opening toward the bonding area, and
   the inductor is disposed in the recess.

7. The vibrator device according to claim 2, wherein
   one of the first member and the second member has a second recess opening toward the bonding area, and
   the inductor is disposed in the second recess.

8. The vibrator device according to claim 1, further comprising:
   a through electrode configured to electrically couple the inductor and the circuit to each other, wherein
   the first member further includes a first surface and a second surface opposite to the first surface,
   the vibrator element is disposed on the first surface,
   the circuit is disposed on the second surface, and
   the through electrode penetrates between the first surface and the second surface of the first member.

* * * * *